US012763779B2

(12) United States Patent
Lee et al.

(10) Patent No.: US 12,763,779 B2
(45) Date of Patent: Oct. 13, 2026

(54) SEMICONDUCTOR PACKAGE CALIBRATING SKEW OF CLOCK SIGNAL, SEMICONDUCTOR DEVICE, AND OPERATING METHOD OF THE SEMICONDUCTOR DEVICE

(71) Applicant: SAMSUNG ELECTRONICS CO., LTD., Suwon-si (KR)

(72) Inventors: Taggun Lee, Suwon-si (KR); Bharath Kumar N, Suwon-si (KR); Seongyoon Kim, Suwon-si (KR); Juyoung Kim, Suwon-si (KR); Donguk Park, Suwon-si (KR); Kihwan Seong, Suwon-si (KR); Hyemun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1 day.

(21) Appl. No.: 19/007,266

(22) Filed: Dec. 31, 2024

(65) Prior Publication Data

US 2025/0373249 A1 Dec. 4, 2025

(30) Foreign Application Priority Data

May 30, 2024 (KR) ........................ 10-2024-0071006
Jul. 12, 2024 (KR) ........................ 10-2024-0092575

(51) Int. Cl.

*H04L 7/00* (2006.01)
*H03K 3/037* (2006.01)
*H03L 7/081* (2006.01)
*H03L 7/091* (2006.01)

(52) U.S. Cl.

CPC ........... *H03L 7/0814* (2013.01); *H03K 3/037* (2013.01); *H03L 7/091* (2013.01)

(58) Field of Classification Search

CPC ........ H03L 7/0814; H03L 7/091; H03K 3/037
USPC ................................ 375/354, 219, 295, 316
See application file for complete search history.

(56) References Cited

U.S. PATENT DOCUMENTS

| | | | |
|---|---|---|---|
| 8,073,090 | B2 | 12/2011 | Zhang et al. |
| 9,684,629 | B2 | 6/2017 | Dickson et al. |
| 9,832,006 | B1 | 11/2017 | Bandi et al. |
| 10,581,587 | B1 | 3/2020 | Gupta et al. |

(Continued)

FOREIGN PATENT DOCUMENTS

KR 10-2024-0013635 A 1/2024

OTHER PUBLICATIONS

The extended European Search Report (EESR) dated 25158605.3, issued in corresponding EP Patent Application No. Jul. 1, 2025.

*Primary Examiner* — Zewdu A Kassa
(74) *Attorney, Agent, or Firm* — Morgan, Lewis & Bockius LLP

(57) ABSTRACT

A semiconductor device includes a receiver and a controller. The receiver is configured to sample a data signal and a track signal received through data lanes in response to rising edges of first and second internal clock signal pairs. The controller is configured to detect a skew status between the track signal and the first and second internal clock signal pairs, based on the number of times a specific logic level of the track signal is sampled in synchronization with each of the first and second internal clock signal pairs, and provide the receiver with a clock shift signal for calibrating a clock skew, based on the skew status.

20 Claims, 30 Drawing Sheets

(56) References Cited

U.S. PATENT DOCUMENTS

| | | | |
|---|---|---|---|
| 11,467,620 | B1 | 10/2022 | Hayashi et al. |
| 11,575,383 | B2 | 2/2023 | Teh et al. |
| 11,789,892 | B2 | 10/2023 | Jen et al. |
| 12,293,807 | B2 | 5/2025 | Go et al. |
| 2015/0100815 | A1 | 4/2015 | Xanthopoulos et al. |
| 2015/0185758 | A1 | 7/2015 | Jung |
| 2022/0271912 | A1* | 8/2022 | Pasdast ..................... G06F 1/04 |
| 2022/0342840 | A1 | 10/2022 | Das et al. |

* cited by examiner

FIG. 15

| SHIFT STATUS | SKEW DIRECTION | A NUMBER OF "1" CAPTURED BY ICP1 | A NUMBER OF "1" CAPTURED BY ICP2 | A NUMBER OF "1" CAPTURED BY ICP3 | A NUMBER OF "1" CAPTURED BY ICP4 |
|---|---|---|---|---|---|
| -5 | LEFT | m | 0 | m | 0 |
| -4 | LEFT | m | 0 | m | 0 |
| -3 | LEFT | m | 0 | m | 0 |
| -2 | LEFT | m | 0 | m | 0 |
| -1 | LEFT | m | 0 | m | 0 |
| 0 | LEFT | m | 0 | m | 0 |
| 1 | ALIGNMENT | N11 | N12 | N13 | N14 |
| 2 | RIGHT | 0 | m | 0 | m |
| 3 | RIGHT | 0 | m | 0 | m |
| 4 | RIGHT | 0 | m | 0 | m |

FIG. 21

| SHIFT STATUS | SKEW DIRECTION | A NUMBER OF "1" CAPTURED BY CP1 | A NUMBER OF "1" CAPTURED BY CP2 | A NUMBER OF "1" CAPTURED BY CP3 | A NUMBER OF "1" CAPTURED BY CP4 |
|---|---|---|---|---|---|
| −5 | LEFT | m | 0 | m | 0 |
| −4 | LEFT | m | 0 | m | 0 |
| −3 | LEFT | m | 0 | m | 0 |
| −2 | LEFT | m | 0 | m | 0 |
| −1 | | N21(≤TH1) | 0 | N22(≤TH1) | 0 |
| 0 | | 0 | 0 | 0 | 0 |
| 1 | | 0 | 0 | 0 | 0 |
| 2 | | 0 | N23(≤TH2) | 0 | N24(≤TH2) |
| 3 | RIGHT | 0 | m | 0 | m |
| 4 | RIGHT | 0 | m | 0 | m |

MOVE −5 (FOR LB)
MOVE −3 (FOR RECAL.)
MOVE −2 (FOR RB)
LB
APS
RB

SEMICONDUCTOR PACKAGE CALIBRATING SKEW OF CLOCK SIGNAL, SEMICONDUCTOR DEVICE, AND OPERATING METHOD OF THE SEMICONDUCTOR DEVICE

CROSS-REFERENCE TO RELATED APPLICATION

This patent application claims priority under 35 U.S.C. § 119 to Korean Patent Application No. 10-2024-0092575 filed on Jul. 12, 2024, and Korean Patent Application No. 10-2024-0071006 filed on May 30, 2024, in the Korean Intellectual Property Office, the disclosures of which are incorporated by reference in their entireties herein.

1. TECHNICAL FIELD

The inventive concept is directed to an electronic device, and more particularly to, a semiconductor package for calibrating skew of a clock signal, a semiconductor device, and an operating method of the semiconductor device.

In modern semiconductor devices, components such as processors, memory units, and peripherals communicate using high-speed data buses and clock signals. As the operating frequency of the semiconductor device increases, the time available for transmitting and processing data between components of the device decreases. To maintain performance, the communication between the components needs to be faster and more tightly synchronized, requiring higher clock frequencies and more reliable timing. an increase in the speed of communication between devices is required.

A clock signal may be used as a timing reference for coordinating the operations of the components in the device. It ensures that data transfers and processing tasks occur at the right moments. The components rely on the alignment of the clock signal with a data signal to correctly interpret transmitted data.

Skew (e.g., timing or clock skew) refers to the difference in timing (phase) between clock signals reaching different components or between the clock signal and the associated data signal at a single component. This skew may be caused by several factors such as variations in propagation delays, capacitive and inductive affects, and temperature and process variations. Clock skew can cause data setup and hold violations, reduced timing margins, and synchronization failures.

Therefore, for reliable data communication, it is necessary to be able to adjust the skew of such clock signals.

SUMMARY

At least one embodiment of the inventive concept provides a semiconductor package for adjusting a skew of a clock signal in consideration of actual clock signals, a semiconductor device, and an operating method of the semiconductor device.

According to an embodiment of the inventive concept, there is provided a semiconductor device including a receiver and a controller. The receiver is configured to receive a data signal through a first data lane, to receive a track signal through a second data lane, to receive a clock signal pair through a complementary clock lane, to generate first and second internal clock signal pairs of different phases based on the clock signal pair, to sample the data signal and the track signal in response to edges of the first and second internal clock signal pairs, and to output digital signals including logic levels of the sampled data signal and track signal. The controller is configured to receive the digital signals, to detect a skew status between the track signal and the first and second internal clock signal pairs based on a first number of times a specific logic level of the track signal is sampled in synchronization with the first internal clock signal pair and a second number of times the specific logic level of the track signal is sampled in synchronization with the second internal clock signal pair, and to provide a clock shift signal including a shift magnitude and a shift direction to shift phases of the first and second internal clock signal pairs based on the skew status.

According to an embodiment of the inventive concept, there is provided an operating method of a semiconductor device. The operating method including generating first and second internal clock signal pairs of different phases based on a clock signal pair received through a complementary clock lane, sampling data signals and a track signal received through data lanes in response to rising edges of the first and second internal clock signal pairs, detecting a skew status between the track signal and the first and second internal clock signal pairs based on a number of times a specific logic level of the track signal is sampled in synchronization with each of the first and second internal clock signal pairs, and shifting phases of the first and second internal clock signal pairs based on the skew status.

According to an embodiment of the inventive concept, there is provided a semiconductor package including a first die, a die-to-die (D2D) interface, and a second die. The first die is configured to generate a data signal, to generate a track signal, and to generate a clock signal pair. The die-to-die (D2D) interface includes a first data lane transmitting the data signal, a second data lane transmitting the track signal, and a complementary clock lane transmitting the clock signal pair. The second die is configured to generate first and second internal clock signal pairs of different phases based on the clock signal pair, to sample the data signal and the track signal based on the first and second internal clock signal pairs, to detect a skew status between the track signal and the first and second internal clock signal pairs based on a number of times a specific logic level of the track signal is sampled in synchronization with each of the first and second internal clock signal pairs, and to adjust phases of the first and second internal clock signal pairs based on the skew status.

BRIEF DESCRIPTION OF THE DRAWINGS

Embodiments will be more clearly understood from the following detailed description taken in conjunction with the accompanying drawings in which:

FIG. 15 is a diagram illustrating a skew direction and an alignment status according to the number of times a specific logic level of a track signal is sampled by an ideal clock phase, according to the inventive concept;

FIG. 21 is a diagram illustrating a skew direction and an alignment possible status (APS) according to the number of times a specific logic level of a track signal is sampled by an actual clock phase, according to the inventive concept;

DETAILED DESCRIPTION

Hereinafter, embodiments of the inventive concept will be described in detail with reference to the attached drawings.

The expressions "first," "second," etc., as used herein, may describe various components, regardless of order and/or importance, and are only used to distinguish one component from another, and do not limit the components. For example, a first user device and a second user device may indicate different user devices, regardless of order or importance. For example, without departing from the scope of the rights set forth herein, a first component may be referred to as a second component, and similarly, a second component may be referred to as a first component.

As used herein, the term "communicate" may include transmitting, receiving, or both transmitting and receiving.

Embodiments provide a method and system for detecting and correcting skew in clock signal systems, ensuring precise synchronization in high-speed semiconductor devices. By leveraging a predefined track signal and synchronized internal clock signal pairs, the system enables accurate sampling and analysis of the track signal's logic levels. A skew status is determined by comparing the number of times the track signal is sampled at specific logic levels against reference thresholds, allowing the detection of misalignment between clock and data signals. The system dynamically adjusts clock signals based on calculated phase shifts, such as an average phase shift, to align the track signal with the clock phases, ensuring synchronization even in the presence of process, voltage, temperature, or aging variations. This robust, real-time correction process enhances the performance and reliability of semiconductor systems operating at high frequencies.

To achieve this, embodiments utilize track clock signal pairs transmitted through complementary clock lanes, where signals with a 180-degree phase difference provide high noise immunity and reduce signal interference. Sampling circuits synchronized with these clock signals capture the track signal at predefined intervals, enabling precise skew detection across multiple phases. By analyzing sampling results, the system determines both the magnitude and direction of the skew, allowing for targeted adjustments. Reference thresholds are used to ensure consistent and reliable detection, while averaging detected phase shifts, such as movements to right and left boundaries, provides a refined metric for alignment. These features make the system particularly suited for high-speed data communication and processing applications, where precision and adaptability to real-time conditions are important.

Figure 1:
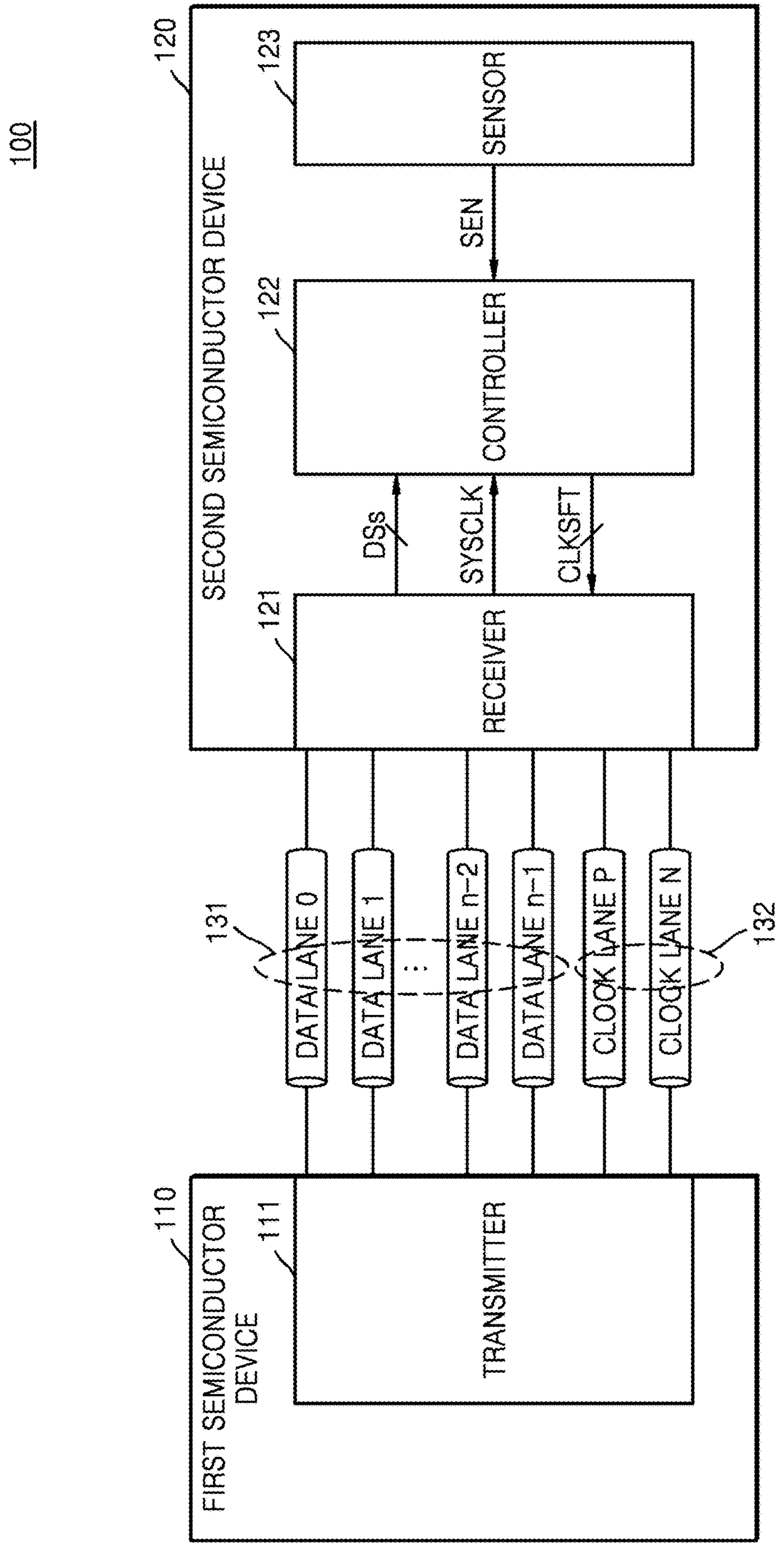
FIG. 1 is a block diagram illustrating a semiconductor system according to an embodiment.

FIG. 1 is a block diagram illustrating a semiconductor system 100 according to an embodiment.

Referring to FIG. 1, the semiconductor system 100 may include a smartphone, a tablet personal computer (PC), a mobile phone, a desktop PC, a camera, a laptop PC, a netbook computer, a medical device, a wearable device, or a home appliance. The wearable device according to some embodiments may be included in products such as an accessory type (e.g., watch, ring, bracelet, anklet, necklace, glasses, contact lens, or head-mounted-device (HMD), etc.), a fabric or clothing integrated (e.g., electronic clothing), a body attachment type (e.g., skin pad or tattoo), or a bio-implantable type (e.g., an implantable circuit). The semiconductor system 100 may be referred to as a multi-chip module (MCM) or a chiplet including semiconductor chips, or semiconductor package including packaged semiconductor chips. The semiconductor system 100 may include a plurality of semiconductor devices. Each semiconductor device may be a unit that performs a function. A semiconductor device may be referred to as a semiconductor chip, a semiconductor intellectual property (IP), or a semiconductor die (or a die).

In some embodiments, the semiconductor system 100 may include a first semiconductor device 110 and a second semiconductor device 120. The first semiconductor device 110 and the second semiconductor device 120 may transmit and receive data signals and at least one clock signal through a predefined interface. The interface according to an embodiment may be a die-to-die (D2D) interface. The D2D interface may be, for example, a chiplet interface according to the universal chiplet interconnect express (UCIe) standard, but the inventive concept is not limited to the above-described example. The D2D interface according to some embodiments may include a plurality of data lanes 131 and a plurality of clock lanes 132. The plurality of data lanes 131 may be paths for transmitting data signals, and the plurality of clock lanes 132 may be paths for transmitting clock signals. In some embodiments, the number of the plurality of data lanes 131 may be n, the number of the plurality of clock lanes 132 may be two, and n may be an integer of 2 or more. The two clock lanes 132 according to an embodiment may be referred to as complementary clock lanes, and two clock signals (e.g., a clock signal pair) transmitted through the complementary clock lanes may be complementary clock signals having a phase difference of 180 degrees. The clock signal pair according to the inventive concept may include two complementary signals, for example, a true signal and a compliment signal. The true signal may be the primary clock signal and the complement signal may be the inverse of the true signal.

In some embodiments, the first semiconductor device 110 may include a transmitter 111 that transmits a plurality of data signals and a clock signal pair to the second semiconductor device 120. The transmitter 111 may be communicatively connected to the receiver 121 through the plurality of data lanes 131 and the plurality of clock lanes 132 of the D2D interface. The transmitter 111 may transmit the clock signal pair to the second semiconductor device 120 through the plurality of clock lanes 132. In addition, the transmitter 111 may transmit the plurality of data signals to the second semiconductor device 120 through the plurality of data lanes 131 in response to edges of the clock signal pair (or synchronized with the edges of the clock signal pair).

When edge timing of the clock signal pair is aligned with each of the plurality of data signals, one semiconductor device that provides information may transmit the plurality of data signals without distortion and another semiconductor device that receives the information may receive the plurality of data signals without distortion. Over time, in the operating semiconductor system 100, a phase or a duty ratio of the clock signal pair may vary due to factors such as process, voltage, and temperature (PVT) changes. As a result, the edges of the clock signal pair and the data signals may become misaligned. To prevent misalignment of the clock signals and the data signals, in some embodiments, any one of the plurality of data lanes 131 may be used to recalibrate the misalignment between the clock signals and the data signals. For example, a data lane DATA LANE n−1 may be used to recalibrate the misalignment between the clock signals and the data signals. In an embodiment, this recalibration is performed by transmitting a signal with a constant pattern (e.g., a track signal) to the second semiconductor device 120 through the data lane DATA LANE n−1. The track signal differs from a normal data signal since it has the constant pattern, whereas a normal data signal can have a variable or arbitrary form. The track signal may also differ from a clock signal. For example, the track signal may have constant, predefined pattern such as a repeating sequence of bits, whereas the clock signal alternates between high and low states with a consistent frequency and duty cycle.

In some embodiments, the second semiconductor device 120 may include a receiver 121 and a controller 122 (e.g., a control circuit).

The receiver 121 may receive the plurality of data signals and the clock signal pair (e.g., an external clock signal pair) from the first semiconductor device 110. The receiver 121 may sample the plurality of data signals based on the clock signal pair. The receiver 121 may provide digital signals DSs including logic levels of the sampled data signals to the controller 122. In an embodiment, the receiver 121 samples the track signal based on the clock signal pair, and provides a digital signal including a logic level of the sampled track signal to the controller 122. The digital signal including the logic level of the sampled track signal may be one of the digital signals DSs. In some embodiments, the receiver 121 may generate a plurality of internal clock signal pairs based on the clock signal pair. The plurality of internal clock signal pairs may be used to sample the plurality of data signals and the track signal. In an embodiment, the number of the plurality of internal clock signal pairs is two, and the number of internal clock signals is four. However, the inventive concept is not limited to the above-described embodiment. The receiver 121 may generate a system clock signal SYSCLK based on the clock signal pairs, and may provide the system clock signal SYSCLK to the controller 122. The system clock signal SYSCLK may be a clock signal used in the controller 122 and/or in various functional blocks of the second semiconductor device 120.

The controller 122 may receive the digital signals DSs including the logic levels of the sampled data signals and the sampled track signal. Hereafter, the sampled data signals and the sampled track signal are referred as the sampled signals. The controller 122 may transmit at least one clock shift signal CLKSFT for adjusting phases of clock signals used in a sampling operation of the receiver 121 to the receiver 121 based on logic levels of the digital signals DSs. In an embodiment, the clock shift signal CLKSFT includes a shift magnitude and a shift direction for shifting phases of clock signals used in the sampling operation of the receiver 121. A series of operations in which the controller 122 shifts the phases of clock signals used in the sampling operation of the receiver 121 may be referred to as a recalibration operation.

In some embodiments, the controller 122 may initiate and perform a recalibration operation every certain period after the semiconductor system 100 performs a training operation on the D2D interface. For example, the controller 122 may initiate and perform the recalibration operation at regular intervals or periodically.

The second semiconductor device 120 according to embodiments may further include a sensor 123. In an embodiment, the sensor 123 senses an internal environment of the second semiconductor device 120, and provides a sensing signal SEN including a sensing value to the controller 122 based on the sensed internal environment. The internal environment may be, for example, an internal voltage applied to the second semiconductor device 120 or an internal temperature. In an embodiment, the sensor 123 is implemented as a temperature sensor that senses the internal temperature of the second semiconductor device 120 and provides the sensing signal SEN to the controller 122. The controller 122 according to an embodiment receives the sensing signal SEN and determines whether to initiate the recalibration operation based on a value of the internal temperature and a value of a reference temperature. For example, the controller 122 may determine whether the internal temperature is greater than or equal to the reference temperature, and may initiate the recalibration operation when the internal temperature is greater than or equal to the reference temperature.

According to the above-described embodiment, there is an effect of increasing the reliability of a chip, die, or a device for receiving data signals by shifting clock signals in consideration of actual clock signals that vary depending on the internal environment.

Figure 2:
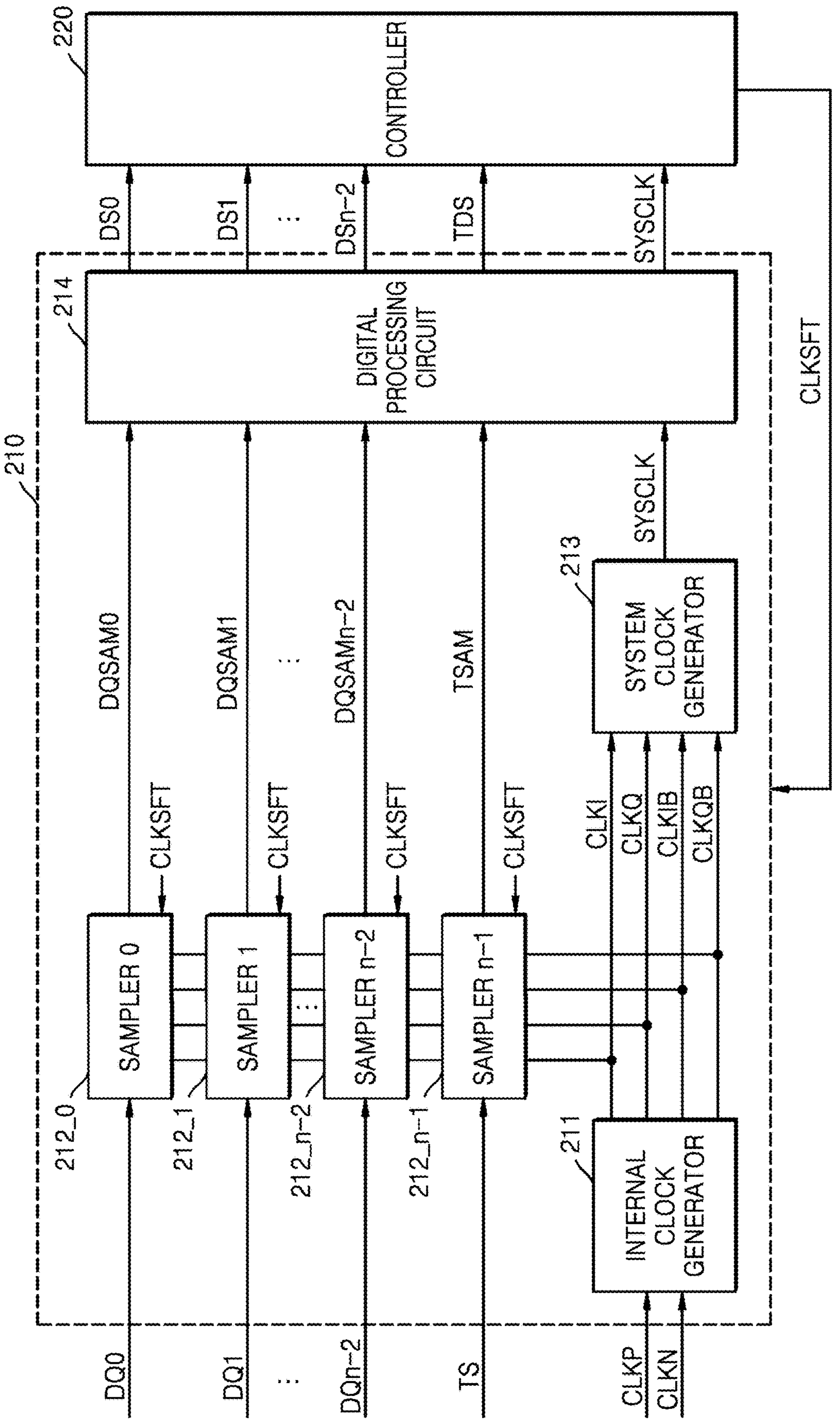
FIG. 2 is a block diagram of a receiver and a controller, according to an embodiment.

FIG. 2 is a block diagram of a receiver 210 and a controller 220 according to an embodiment. The receiver 210 may be used to implement the receiver 121 and the controller 220 may be used to implement the controller 122.

Referring to FIG. 2, the receiver 210 may receive a plurality of data signals DQ0 to DQn−2, a track signal TS, and a clock signal pair CLKP and CLKN. The frequency of the clock signal pair CLKP and CLKN may be, for example, 16 gigahertz (GHz) according to the Universal Chiplet Interconnect Express (UCIe) standard. However, the inventive concept is not limited to the above-described example. In an embodiment, the total number of data lanes may be n, and the number of the plurality of data signals DQ0 to DQn−2 may be n−1. In addition, the plurality of data signals DQ0 to DQn−2 may be transmitted to the receiver 210 through n−1 data lanes and the track signal TS may be transmitted to the receiver 210 through the remaining one of the n data lanes. The first clock signal CLKP of the clock signal pair CLKP and CLKN may be transmitted to the receiver 210 through any one of the plurality of clock lanes 132, and the second clock signal CLKP of the clock signal pair CLKP and CLKN may be transmitted to the receiver 210 through the other one of the plurality of clock lanes 132. Here, n may be an integer greater than or equal to 2.

The receiver 210 may generate a first internal clock signal pair CLKI and CLKIB and generate a second internal clock signal pair CLKQ and CLKQB, each having different phases based on the clock signal pair CLKP and CLKN. The receiver 210 may sample each of the plurality of data signals DQ0 to DQn−2 and the track signal TS in response to edges of the first and second internal clock signal pairs CLKI, CLKIB, CLKQ, and CLKQB. The receiver 210 may provide digital signals DS0 to DSn−2 and TDS including logic levels of the sampled signals to the controller 220. The digital signals DS0 to DSn−2 may include logic levels of samples of the plurality of sampled data signals DQ0 to DQn−2, and the digital signal TDS may include a logic level of a sample of the sampled track signal TS.

In an embodiment, the receiver 210 may include an internal clock generator 211, a plurality of samplers 212_0 to 212_*n*−1 (e.g., sampling circuits), a system clock generator 213, and a digital processing circuit 214 (e.g., a digital signal processor).

The internal clock generator 211 may generate a first true signal CLKI, a first complement signal CLKIB, a second true signal CLKQ, and a second complement signal CLKQB based on the clock signal pair CLKP and CLKN. A phase difference between the first true signal CLKI and the first complement signal CLKIB may be 180 degrees. A phase difference between the second true signal CLKQ and the second complement signal CLKQB may also be 180 degrees. An ideal phase difference between the first true signal CLKI and the second true signal CLKQ may be 90 degrees, but an actual phase difference according to an internal condition of the second semiconductor device 120 may be the same as or different from the ideal phase difference. An ideal phase difference between the first complement signal CLKIB and the second complement signal CLKQB may be 90 degrees, but an actual phase difference according to an internal condition of the second semiconductor device 120 may be the same as or different from the ideal phase difference. In an embodiment, the internal clock generator 211 is implemented by a divider (e.g., a divider circuit) that changes a frequency and a phase. In an embodiment, when the frequency of the clock signal pair CLKP and CLKN according to the UCIe standard is 16 GHZ, the frequency of each of the first and second internal clock signal pairs CLKI, CLKIB, CLKQ, and CLKQB is 8 GHz. However, the inventive concept is not limited to the above-described example.

The plurality of samplers 212_0 to 212_*n*−1 may receive the first and second internal clock signal pairs CLKI, CLKIB, CLKQ, and CLKQB. The plurality of samplers 212_0 to 212_*n*−1 may sample signals in response to an edge of each of the first and second internal clock signal pairs CLKI, CLKIB, CLKQ, and CLKQB. Once the signal is sampled, one sample may be generated. For example, some samplers 212_0 to 212_*n*−2 may sample the plurality of data signals DQ0 to DQn−2 and output data samples DQSAM0 to DQSAMn−2 of the plurality of data signals DQ0 to DQn−2. A sampler for sampling one data signal may be referred to as a data sampler. One sampler 212_*n*−1 may sample the track signal TS to output a track sample TSAM of the track signal TS. A sampler for sampling the track signal TS may be referred to as a track sampler.

The system clock generator 213 may generate the system clock signal SYSCLK based on the first and second internal clock signal pairs CLKI, CLKIB, CLKQ, and CLKQB. In an embodiment, the system clock generator 213 is implemented by a divider, and when the frequency of each of the first and second internal clock signal pairs CLKI, CLKIB, CLKQ, and CLKQB according to an embodiment is 8 GHz, the frequency of the system clock signal SYSCLK is 2 GHz. However, the inventive concept is not limited to the above-described example.

The digital processing circuit 214 may provide the digital signals DS0 to DSn−2 and TDS including logic levels of the sampled signals to the controller 220 and provide the system clock signal SYSCLK to the controller 220. For example, the digital processing circuit 214 may output the digital signals DS0 to DSn−2 including logic levels of the data samples DQSAM0 to DQSAMn−2. The digital processing circuit 214 may output the digital signal TDS including a logic level of the track sample TSAM.

The controller 220 may receive the digital signals DS0 to DSn−2 and TDS and the system clock signal SYSCLK. The controller 220 may detect a skew status between the track signal TS and the first and second internal clock signal pairs CLKI, CLKIB, CLKQ, and CLKQB based on a first number of times and a second number of times.

The first number of times may be the number of times that a specific logic level of the track signal TS is sampled by the first internal clock signal pair CLKI and CLKIB. The second number of times may be the number of times that a specific logic level of the track signal TS is sampled by the second internal clock signal pair CLKQ and CLKIQ. Here, the specific logic level of the track signal TS may be a logic high level or a logic low level. For example, the first number of times may be the number of times that a logic high level of the track signal TS is sampled by the first true signal CLKI, or the number of times that the logic high level of the track signal TS is sampled by the first complement signal CLKIB. For example, the second number of times may be the number of times that the logic high level of the track signal TS is sampled by the second true signal CLKQ, or the number of times that the logic high level of the track signal TS is sampled by the second complement signal CLKQB. For example, any of the signals CLKI, CLKIB, CLKQ and CLKQB may provide a timing reference, and a sampler may be used to perform sampling of the track signal TS based on the timing reference. However, the inventive concept is not limited to the above-described example.

A skew status may include a skew direction indicating in which direction a clock signal is skewed and a skew magnitude indicating an amount by which the clock signal is skewed. The skew direction may be indicated as left or right, or leading or lagging. The skew magnitude may be indicated as a product of a preset clock movement unit. For example, the skew magnitude may be expressed as a multiple of a present clock movement unit, representing the quantized adjustment or measurement of timing skew. The skew according to the inventive concept may also be referred to as clock drift or drift.

The controller 220 may provide the clock shift signal CLKSFT to the receiver 210 based on the skew status. The clock shift signal CLKSFT may include a shift magnitude and a shift direction for shifting phases of the first and second internal clock signal pairs CLKI, CLKIB, CLKQ, and CLKQB. The shift magnitude may correspond to the skew magnitude, and the shift direction may be a direction opposite to the skew direction.

In some embodiments, each of the plurality of samplers 212_0 to 212_*n*−1 may shift the phases of the first and second internal clock signal pairs CLKI, CLKQ, CLKIB, and CLKQB based on the clock shift signal CLKSFT.

Figure 3:
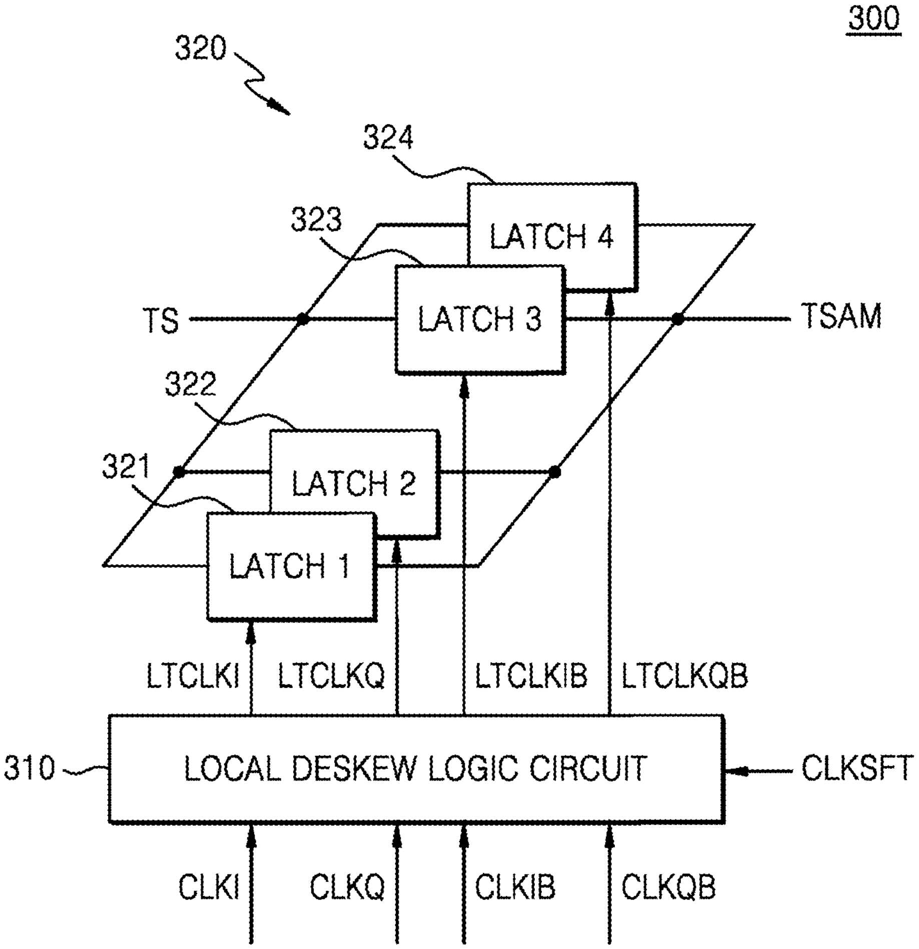
FIG. 3 is a block diagram of a track sampler according to an embodiment.

FIG. 3 is a block diagram of a track sampler 300 according to an embodiment. For example, the track sampler 300 may be used to implement sampler 212_*n*−1.

Referring to FIG. 3, the track sampler 300 may generate first and second track clock signal pairs LTCLKI, LTCLKIB, LTCLKQ, and LTCLKQB based on the clock shift signal CLKSFT and the first and second internal clock signal pairs CLKI, CLKIB, CLKQ, and sample the track signal TS in response to rising edges of the first and second track clock signal pairs LTCLKI, LTCLKIB, LTCLKQ, and LTCLKQB. In an embodiment, the track sampler 300 may include a local deskew logic circuit 310 and a plurality of latch circuits 320.

The local deskew logic circuit 310 may receive the first and second internal clock signal pairs CLKI, CLKIB, CLKQ, and CLKQB and the clock shift signal CLKSFT. The local deskew logic circuit 310 may shift phases of the first and second internal clock signal pairs CLKI, CLKIB, CLKQ, and CLKQB according to a shift direction and a shift magnitude of the clock shift signal CLKSFT, and may provide the first and second track clock signal pairs LTCLKI, LTCLKIB, LTCLKQ, and LTCLKQB to the plurality of latch circuits 320. The first track clock signal pair LTCLKI and LTCLKIB may include a first track true signal LTCLKI and a first track complement signal LTCLKIB. The second track clock signal pair LTCLKQ and LTCLKQB may include a second track true signal LTCLKQ and a second track complement signal LTCLKQB. Embodiments of the first and second track clock signal pairs LTCLKI, LTCLKIB, LTCLKQ, and LTCLKQB will be described below with reference to FIGS. 6 and 8.

The plurality of latch circuits 320 may latch the track signal TS in response to the rising edges of the first and second track clock signal pairs LTCLKI, LTCLKIB, LTCLKQ, and LTCLKQB and output the track sample TSAM. In some embodiments, the number of the plurality of latch circuits 320 may correspond to the number of internal clock signals. For example, four internal clock signals, i.e., the first and second internal clock signal pairs CLKI, CLKQ, CLKIB, and CLKQB, may be generated in the receiver 210, and thus, the plurality of latch circuits 320 may include first to fourth latches 321, 322, 323, and 324. The first latch circuit 321 may latch the track signal TS in response to the rising edge of the first track true signal LTCLKI. The second latch circuit 322 may latch the track signal TS in response to the rising edge of the second track true signal LTCLKQ. The third latch circuit 323 may latch the track signal TS in response to the rising edge of the first track complement signal LTCLKIB. The fourth latch circuit 324 may latch the track signal TS in response to the rising edge of the second track complement signal LTCLKQB. Values sequentially sampled by the first to fourth latches 321, 322, 323, and 324 may be sequentially output as the track samples TSAM. For example, each of the first to fourth latch circuits 321, 322, 323, and 324 outputs a distinct sample of the track signal TS based on the timing of the corresponding rising edge of its respective track clock signal (e.g., LTCLKI, LTCLKQ, LTCLKIB or LTCLKQB), such that the values sequentially sampled by the latches collectively form the track samples TSAM.

Figure 4:
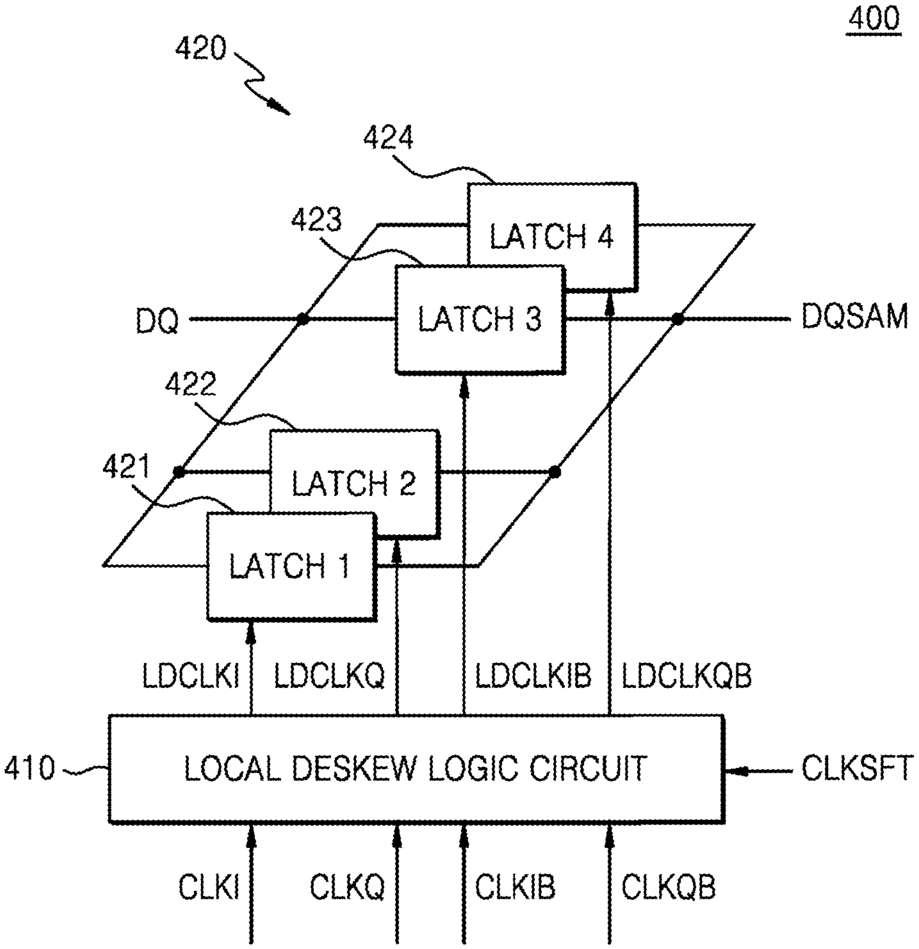
FIG. 4 is a block diagram of a data sampler according to an embodiment.

FIG. 4 is a block diagram of a data sampler 400 according to an embodiment. For example, the data sampler 400 may be used to implement samplers 212_0, 212_1, or 212_*n*−2.

Referring to FIG. 4, the data sampler 400 may generate first and second data clock signal pairs LDCLKI, LDCLKIB, LDCLKQ, and LDCLKQB based on the clock shift signal CLKSFT and the first and second internal clock signal pairs CLKI, CLKIB, CLKQ, and CLKQB. The data sampler 400 may sample a data signal DQ in response to rising edges of the first and second data clock signal pairs LDCLKI, LDCLKIB, LDCLKQ, and LDCLKQB.

Each of the first and second data clock signal pairs LDCLKI, LDCLKIB, LDCLKQ, and LDCLKQB may include a data true signal and a data complement signal. For example, the first data clock signal pair LDCLKI and LDCLKIB may include a first data true signal LDCLKI and a first data complement signal LDCLKIB, and the second data clock signal pair LDCLKQB may include a second data true signal LDCLKQ and a second data complement signal LDCLKQB. The first and second data clock signal pairs LDCLKI, LDCLKIB, LDCLKQ, and LDCLKQB may respectively have a certain phase difference from the corresponding first and second track clock signal pairs LTCLKI, LTCLKIB, LTCLKQ, and LTCLKQB. For example, there is a phase difference between a data true signal and a track true signal, and a phase difference between a data complement signal and a track complement signal.

In an embodiment, the data sampler 400 may include a local deskew logic circuit 410 and a plurality of latch circuits 420. The plurality of latch circuits 420 according to an embodiment may include first to fourth latch circuits 421, 422, 423, and 424.

The local deskew logic circuit 410 may shift phases of the first and second internal clock signal pairs CLKI, CLKIB, CLKQ, and CLKQB according to a shift direction and a shift magnitude of the clock shift signal CLKSFT, and output the first and second data clock signal pairs LDCLKI, LDCLKIB, LDCLKQ, and LDCLKQB. The first data true signal LDCLKI may be provided to the first latch circuit 421. The second data true signal LDCLKQ may be provided to the second latch circuit 422. The first data complement signal LDCLKIB may be provided to the third latch circuit 423. The second data complement signal LDCLKQB may be provided to the fourth latch circuit 424.

The first latch circuit 421 may latch the data signal DQ in response to the rising edge of the first data true signal LDCLKI. The second latch circuit 422 may latch the data signal DQ in response to the rising edge of the second data true signal LDCLKQ. The third latch circuit 423 may latch the data signal DQ in response to the rising edge of the first data complement signal LDCLKIB. The fourth latch circuit 424 may latch the data signal DQ in response to the rising edge of the second data complement signal LDCLKQB. Values sequentially sampled by the first to fourth latch circuits 421, 422, 423, and 424 may be sequentially output as data samples DQSAM. For example, each of the first to fourth latch circuits 421, 422, 423, and 424 outputs a distinct sample of the data signal DQ based on the timing of the rising edge of its respective data clock signal (LDCLKI, LDCLKQ, LDCLKIB, LDCLKQB), such that the values sequentially sampled by the latches collectively form the data samples DQSAM.

Figure 5:
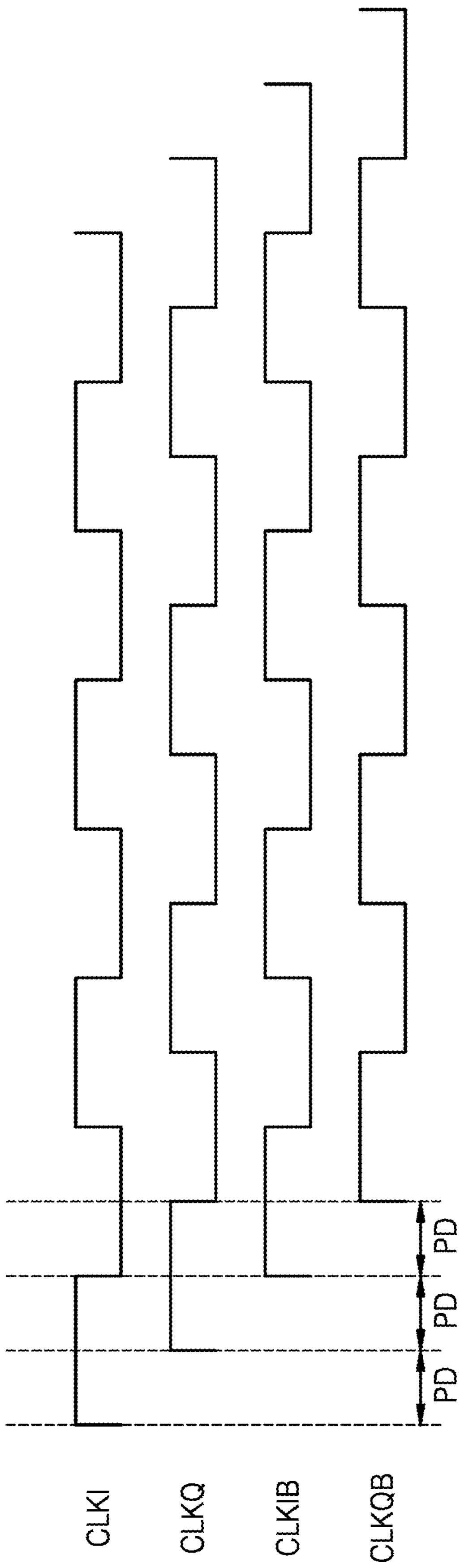
FIG. 5 is a timing diagram of first and second track clock signal pairs according to an embodiment.

FIG. 5 is a timing diagram of the first and second internal clock signal pairs CLKI, CLKIB, CLKQ, and CLKQB according to an embodiment.

Referring to FIG. 5, the first and second internal clock signal pairs CLKI, CLKIB, CLKQ, and CLKQB according to an embodiment may be toggled. Rising edges may sequentially occur in the order of the first true signal CLKI, the second true signal CLKQ, the first complement signal CLKIB, and the second complement signal CLKQB. In the case of the ideal first and second internal clock signal pairs CLKI, CLKIB, CLKQ, and CLKQB, a phase difference PD between the first true signal CLKI and the second true signal CLKQ, the phase difference PD between the second true signal CLKQ and the first complement signal CLKIB, and the phase difference PD between the first complement signal CLKIB and the second complement signal CLKQB may be the same as 90 degrees.

Figure 6:
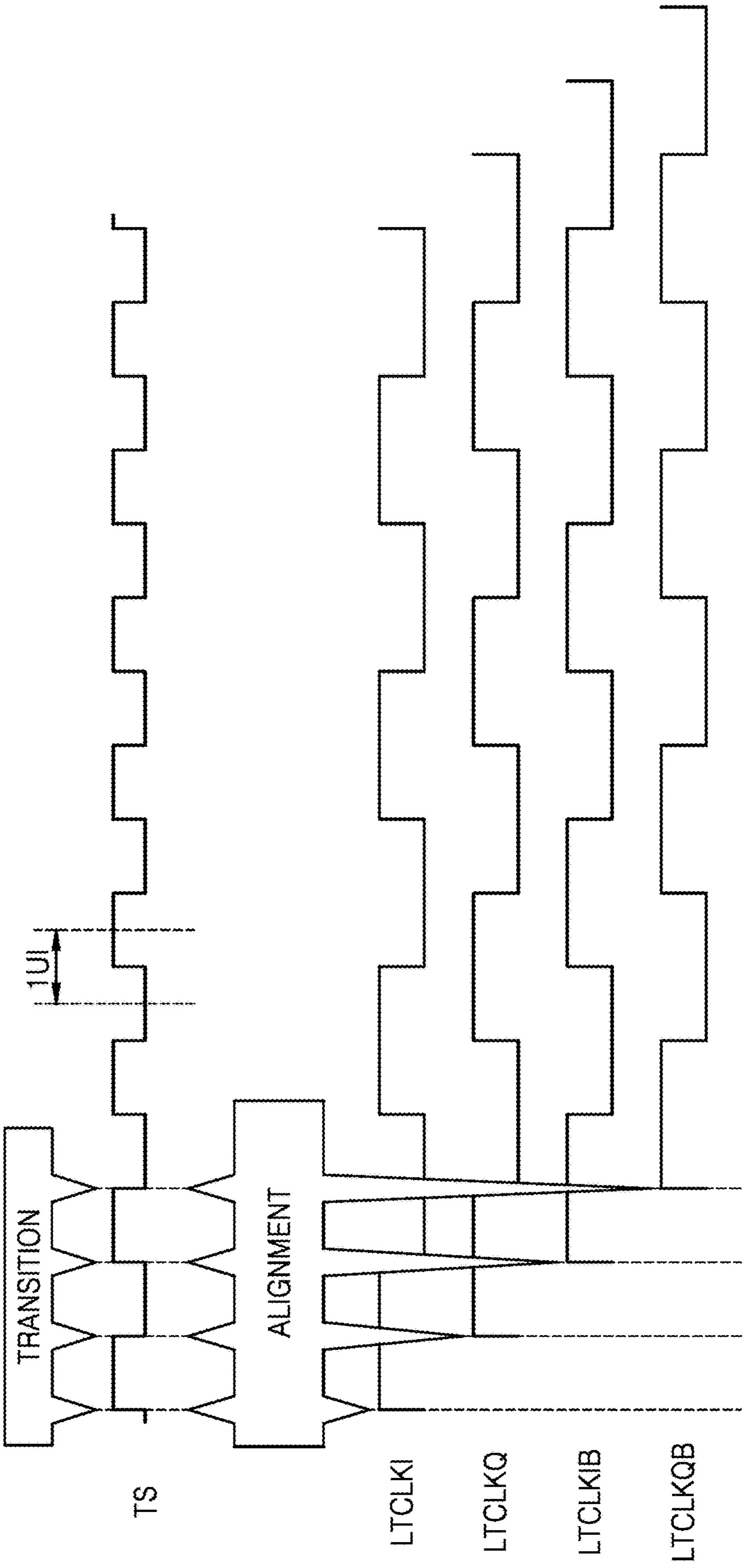
FIG. 6 is a timing diagram for explaining an alignment status of a track signal and first and second track clock signal pairs, according to an embodiment.

FIG. 6 is a timing diagram for explaining an alignment status of the track signal TS and the first and second track clock signal pairs LTCLKI, LTCLKIB, LTCLKQ, and LTCLKQB according to an embodiment.

Referring to FIGS. 5 and 6, the track signal TS may be toggled to a logic high level and a logic low level. The logic high level may correspond to "1", and the logic low level may correspond to "0". In the toggled track signal TS, there is a section in which a logic level is transitioned from the logic high level to the logic low level, or there is a section in which the logic level is transitioned from the logic low level to the logic high level. The section in which the logic level is transitioned may be referred to as a transition section. A period of the track signal TS may correspond to a 2 unit interval (UI).

The first and second track clock signal pairs LTCLKI, LTCLKIB, LTCLKQ, and LTCLKQB may be generated based on the first and second internal clock signal pairs CLKI, CLKIB, CLKQ, and CLKQB of FIG. 5. When a rising edge of each of the first track true signal LTCLKI, the first track complement signal LTCLKIB, the second track true signal LTCLKQ, and the second track complement signal LTCLKQB is located in the transition section of the track signal TS, the first and second track clock signal pairs LTCLKI, LTCLKIB, LTCLKQ, and LTCLKQB are aligned. That is, the first track true signal LTCLKI, the first track complement signal LTCLKIB, the second track true signal LTCLKQ, the second track complement signal LTCLKQB, and the track signal TS of FIG. 6 may be have an alignment status.

In some embodiments, when the semiconductor system 100 is initialized and a training operation on a D2D interface is performed, the second semiconductor device 120 may shift phases of the first and second track clock signal pairs LTCLKI, LTCLKIB, LTCLKQ, and LTCLKQB so that the rising edges of the first and second track clock signal pairs LTCLKI, LTCLKIB, LTCLKQ, and LTCLKQB are aligned to the transition section of the track signal TS. The rising edges of the first and second track clock signal pairs LTCLKI, LTCLKIB, LTCLKQ, and LTCLKQB are located in the transition section of the track signal TS, and thus, the first track true signal LTCLKI, the first track complement signal LTCLKIB, the second track true signal LTCLKQ, the second track complement signal LTCLKQB, and the track signal TS of FIG. 6 are aligned. The second semiconductor device 120 may set locations of the shifted first and second track clock signal pairs LTCLKI, LTCLKIB, LTCLKQ, and LTCLKQB as initial locations.

Figure 7:
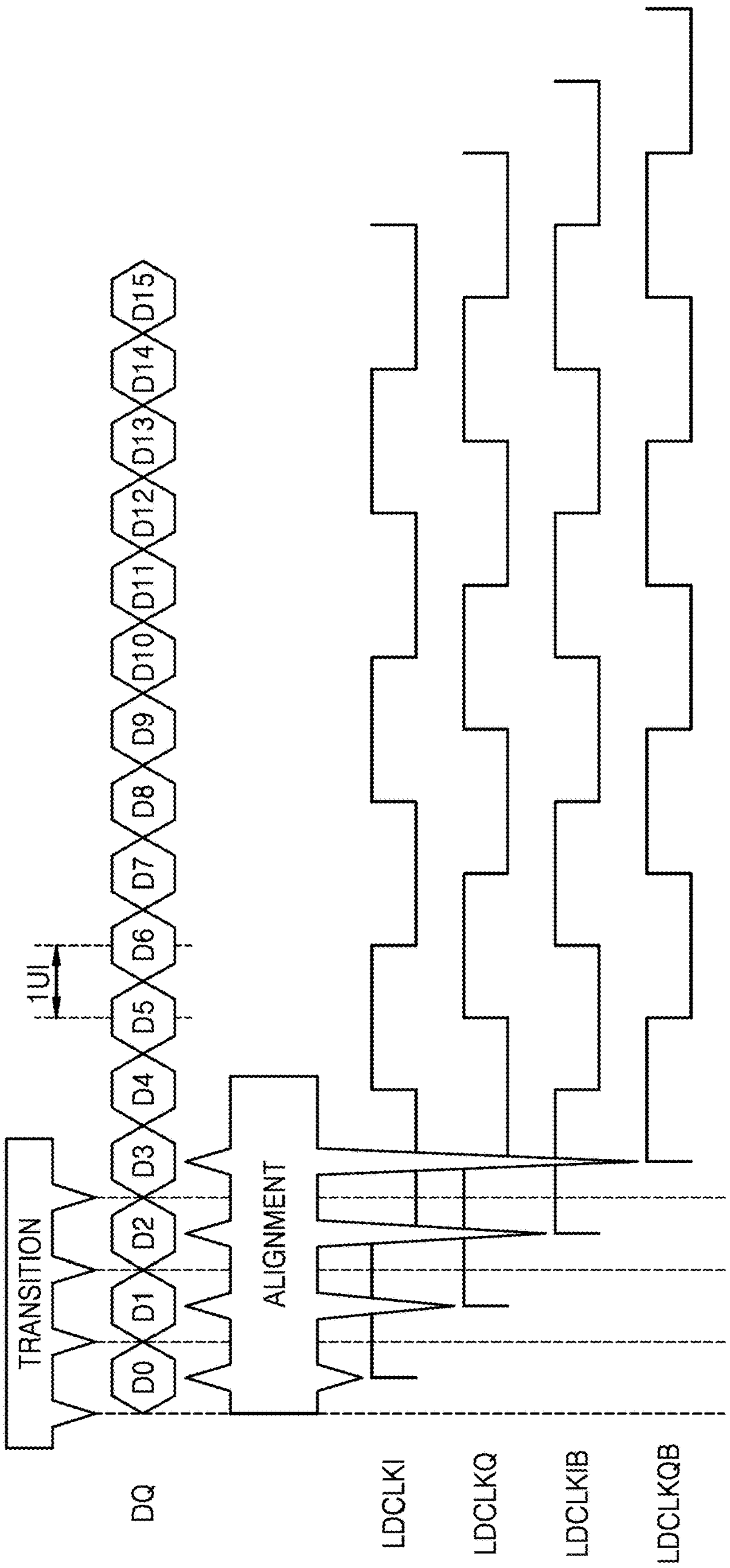
FIG. 7 is a timing diagram for explaining an alignment status of a data signal and first and second data clock signal pairs, according to an embodiment.

FIG. 7 is a timing diagram for explaining an alignment status of the data signal DQ and the first and second data clock signal pairs LDCLKI, LDCLKIB, LDCLKQ, and LDCLKQB according to an embodiment.

Referring to FIGS. 5, 6, and 7, the data signal DQ may include logic levels (e.g., D0 to D15). Like the toggled track signal TS of FIG. 6, there is a transition section between the logic levels D0 to D15 of the data signal DQ. A section in which one logic level is maintained in the data signal DQ or a section between the center of one logic level and the center of the other logic level may correspond to a 1 UI.

The first and second data clock signal pairs LDCLKI, LDCLKIB, LDCLKQ, and LDCLKQB may be generated based on the first and second internal clock signal pairs CLKI, CLKIB, CLKQ, and CLKQB of FIG. 5. When a rising edge of each of the first data true signal LDCLKI, the first data complement signal LDCLKIB, the second data true signal LDCLKQ, and the second data complement signal LDCLKQB is located within a section other than the transition section of the data signal DQ, the first and second data clock signal pairs LDCLKI, LDCLKIB, LDCLKQ, and LDCLKQB and the data signal DQ may be aligned. The first data true signal LDCLKI, the first data complement signal LDCLKIB, the second data true signal LDCLKQ, the second data complement signal LDCLKQB, and the data signal DQ of FIG. 7 may have an alignment status. In an embodiment, when the rising edges of the first and second data clock signal pairs LDCLKI, LDCLKIB, LDCLKQ, and LDCLKQB are located at the center of the data signal DQ as shown in FIG. 7, it may be determined that the first data true signal LDCLKI, the first data complement signal LDCLKIB, the second data true signal LDCLKQ, the second data complement signal LDCLKQB, and the data signal DQ of FIG. 7 have an ideal alignment.

In some embodiments, a phase difference between a track clock signal pair and a data clock signal pair may correspond to a 0.5 UI. For example, the phase difference between the track true signal (e.g., LTCLKI) and the data true signal (e.g., LDCLKI), and the phase difference between a track complement signal (e.g., LTCLKIB) and a data complement signal (e.g., LDCLKIB) may correspond to the 0.5 UI. When initial locations of the first and second track clock signal pairs LTCLKI, LTCLKIB, LTCLKQ, and LTCLKQB are set upon initialization of the semiconductor system 100, the phases of the first and second data clock signal pairs LDCLKI, LDCLKIB, LDCLKQ, and LDCLKQB may be delayed by a 0.5 UI more than phases of the first and second track clock signal pairs LTCLKI, LTCLKIB, LTCLKQ, and LTCLKQB. To this end, the local deskew logic circuit 410 of the data sampler 400 may shift or delay a signal by an additional 0.5 UI compared to the shift or delay applied by the local deskew logic circuit 310 of the track sampler 300.

Figure 8:
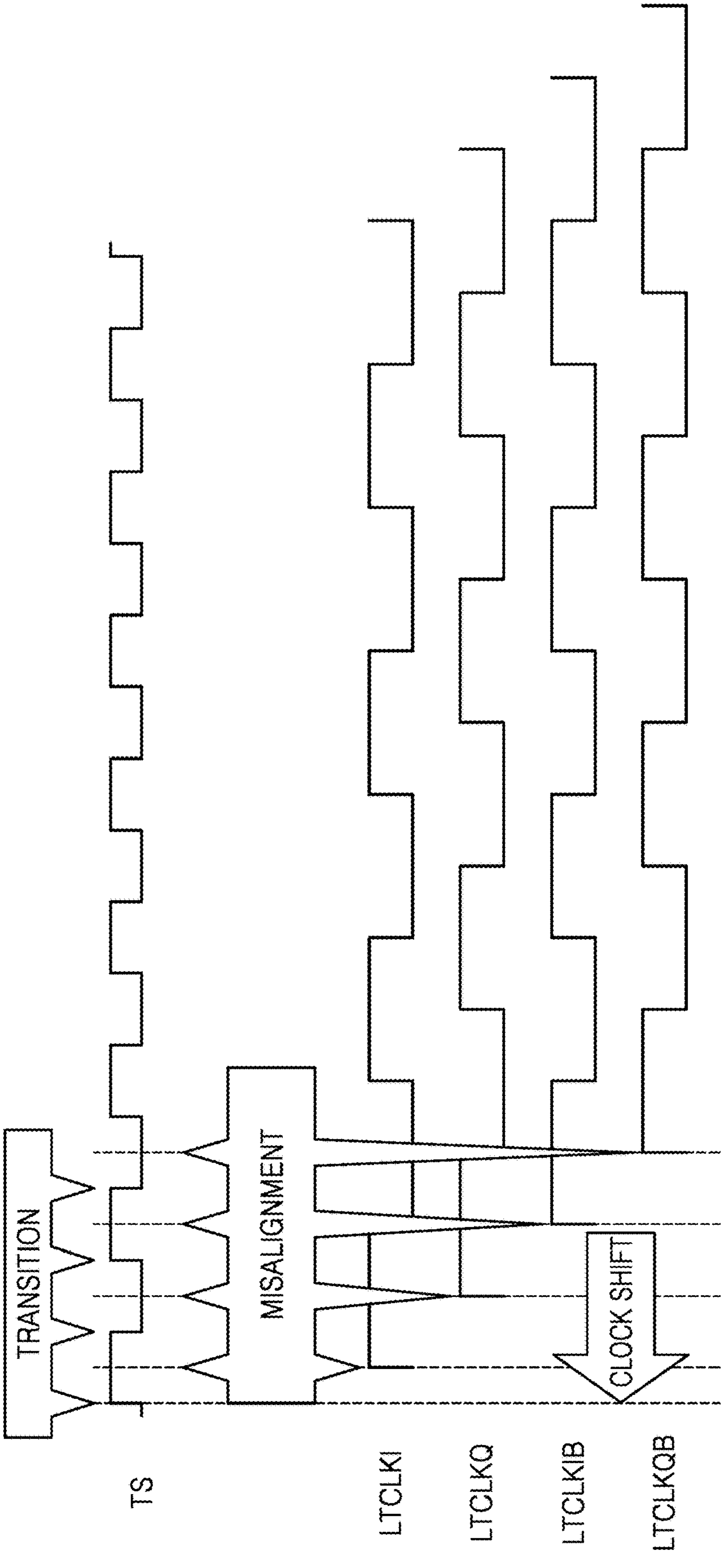
FIG. 8 is a timing diagram for explaining a misalignment status of a track signal and first and second track clock signal pairs, according to an embodiment.

FIG. 8 is a timing diagram for explaining a misalignment status of the track signal TS and the first and second track clock signal pairs LTCLKI, LTCLKIB, LTCLKQ, and LTCLKQB according to an embodiment.

Referring to FIGS. 6 and 8, the first track true signal LTCLKI, the first track complement signal LTCLKIB, the second track true signal LTCLKQ, the second track complement signal LTCLKQB, and the track signal TS of FIG. 8 may be misaligned due to an internal temperature over time. Referring to FIGS. 6 and 8, for example, the first and second track clock signal pairs LTCLKI, LTCLKIB, LTCLKQ, and LTCLKQB of FIG. 6 may drift as shown in FIG. 8 as the internal temperature increases. Accordingly, rising edges of the first and second track clock signal pairs LTCLKI, LTCLKIB, LTCLKQ, and LTCLKQB may be located in a section other than the transition section of the track signal TS. Thus, the first track true signal LTCLKI, the first track complement signal LTCLKIB, the second track true signal LTCLKQ, the second track complement signal LTCLKQB, and the track signal TS of FIG. 8 have a misalignment status. In this case, the phases of the first and second track clock signal pairs LTCLKI, LTCLKIB, LTCLKQ, and LTCLKQB are shifted by using shift information CLOCK SHIFT that is the same as a drift magnitude in the opposite direction to a drift direction such that the rising edges of the first and second track clock signal pairs LTCLKI, LTCLKIB, LTCLKQ, and LTCLKQB become located in the transition section of the track signal TS.

Figure 9:
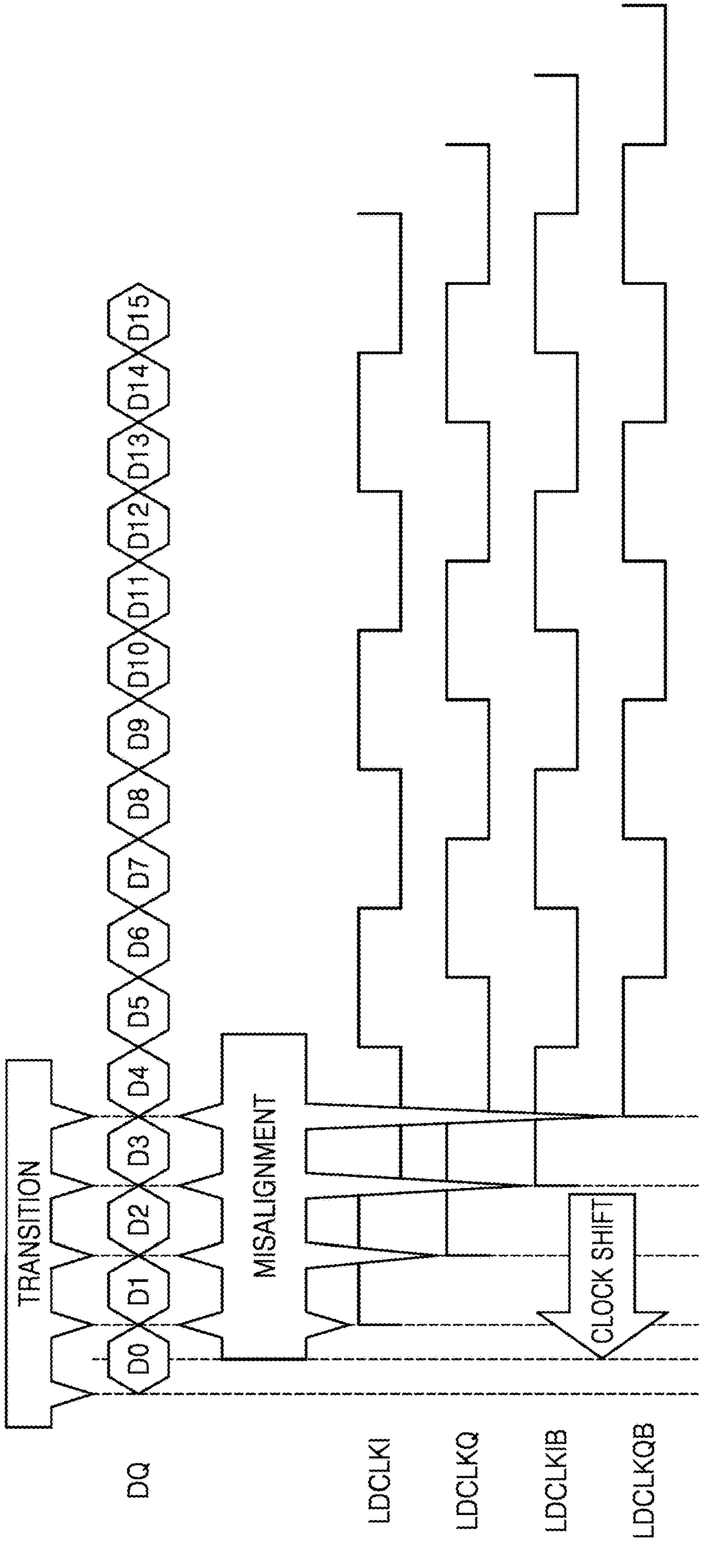
FIG. 9 is a timing diagram for explaining a misalignment status of a data signal and first and second data clock signal pairs, according to an embodiment.

FIG. 9 is a timing diagram for explaining a misalignment status of the data signal DQ and the first and second data clock signal pairs LDCLKI, LDCLKIB, LDCLKQ, and LDCLKQB according to an embodiment.

Referring to FIGS. 7, 8, and 9, as the first and second track clock signal pairs LTCLKI, LTCLKIB, LTCLKQ, and LTCLKQB drift, the first and second data clock signal pairs LDCLKI, LDCLKIB, LDCLKQ, and LDCLKQB may also drift. Drift magnitudes of the first and second track clock signal pairs LTCLKI, LTCLKIB, LTCLKQ, and LTCLKQB may be the same as drift magnitudes of the first and second data clock signal pairs LDCLKI, LDCLKIB, LDCLKQ, and LDCLKQB. Accordingly, rising edges of the first and second data clock signal pairs LDCLKI, LDCLKIB, LDCLKQ, and LDCLKQB are located in a transition section of the data signal DQ, and the first data true signal LDCLKI, the first track true signal LTCLKI, the second track true signal LTCLKQ, the second track complement signal LTCLKQB, and the data signal DQ of FIG. 9 are have a misalignment status. In this case, it is necessary to shift the phases of the first and second track clock signal pairs LTCLKI, LTCLKIB, LTCLKQ, and LTCLKQB are shifted using the shift information CLOCK SHIFT of FIG. 8.

Figure 10:
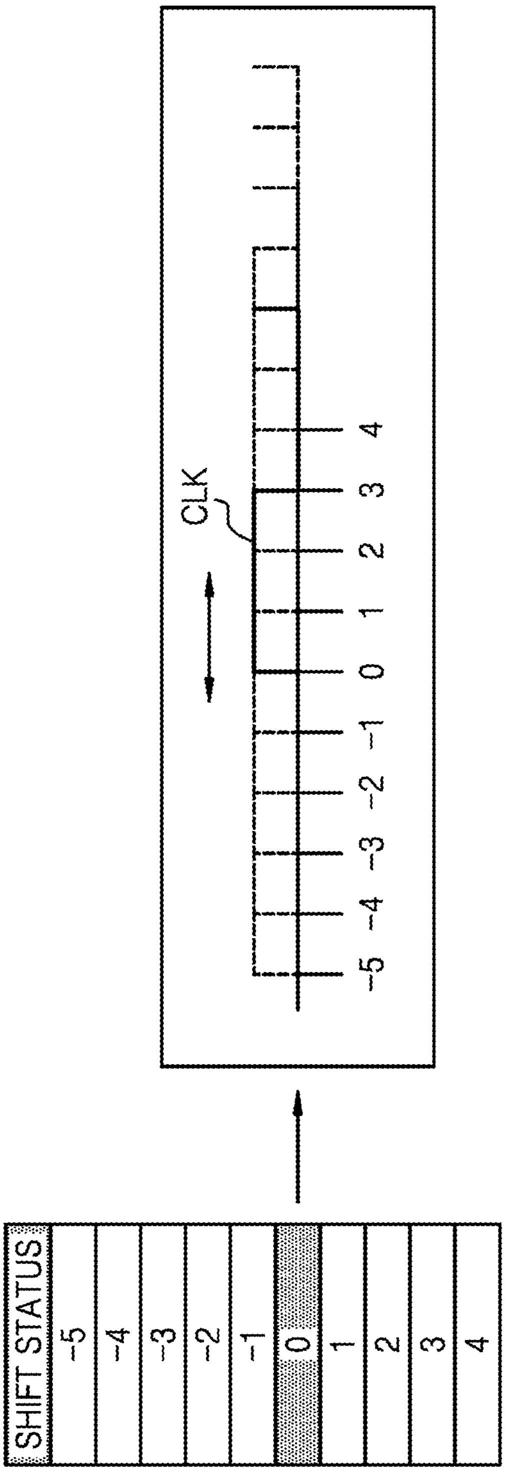
FIG. 10 is a diagram illustrating a shift status of a clock signal and a relative location of the clock signal, according to the inventive concept.

FIG. 10 is a diagram illustrating a shift status of a clock signal CLK and a relative location of the clock signal CLK according to the inventive concept.

Referring to FIG. 10, the shift status may be a concept indicating the relative location at which the clock signal CLK is to be shifted. The shift status may have an unknown value that the controller 220 is unable to check. FIG. 10 shows that a value of the shift status ranges from "−5" to "4". However, the range shown in FIG. 10 is merely an example of possible values of the shift status. The shift status having an initial value of "0" may indicate that the clock signal CLK is at an initial location at which a rising edge occurs at the location of "0" of the shift status. As the value of the shift status decreases from "0" (e.g., the value decreases in the order of "−1", "−2", "−3", "−4", and "−5"), a phase of the clock signal CLK (i.e., the location of the clock signal CLK) may be shifted such that the rising edge of the clock signal CLK is moved to the left by one column as shown in FIG. 10. As the value of the shift status increases from "0" (e.g., the value increases in the order of "1", "2", "3", and "4), the phase of the clock signal CLK may be shifted such that the rising edge of the clock signal CLK is moved to the right by one column as shown in FIG. 10. A movement unit in which the clock signal CLK moves may be one column (e.g., from "0" to "−1") and may be the minimum unit of a shift magnitude.

Figure 11:
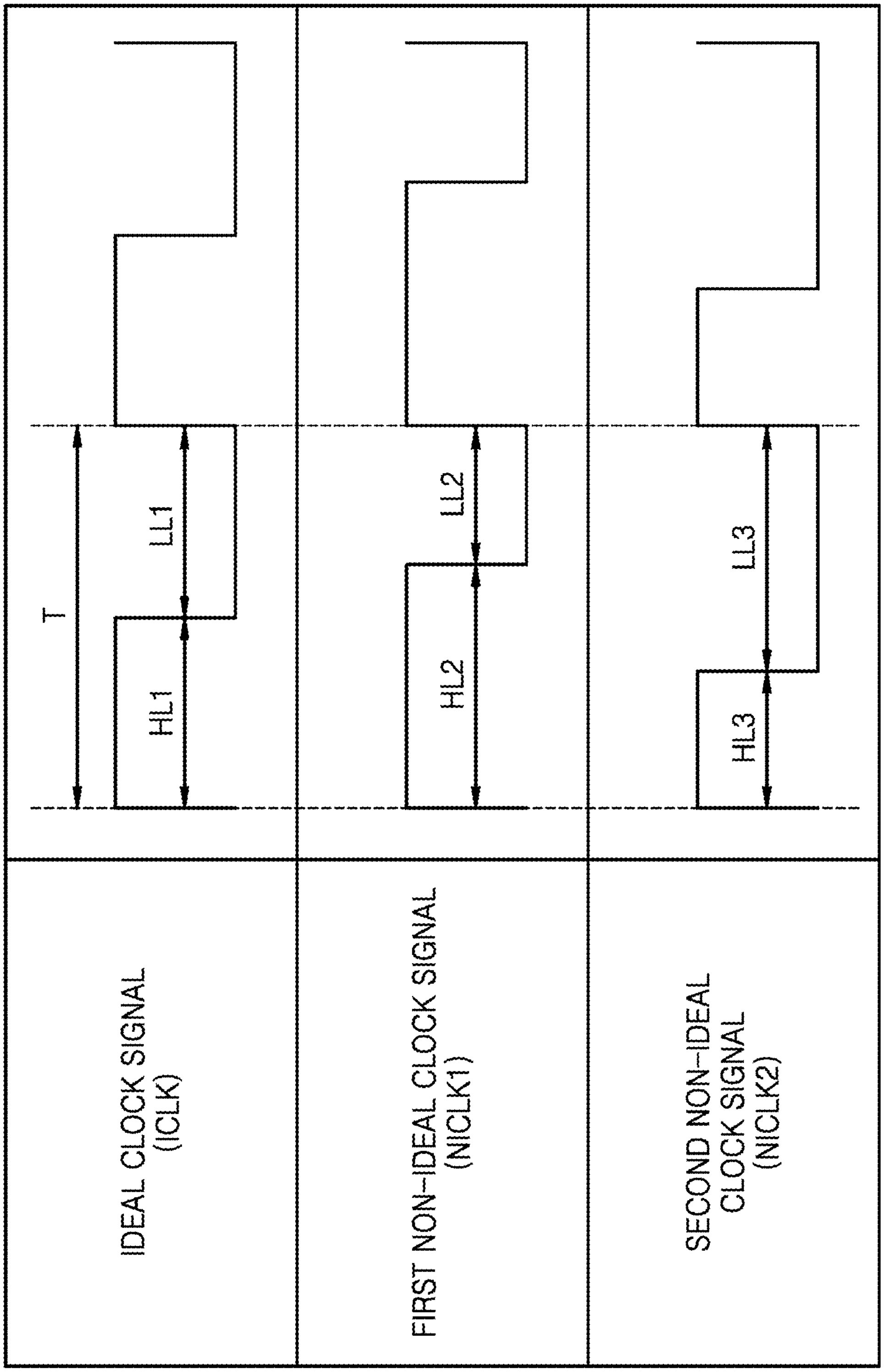
FIG. 11 is a diagram illustrating actual clock signals according to the inventive concept.

FIG. 11 is a diagram illustrating actual clock signals ICLK, NICLK1, and NICLK2 according to the inventive concept.

Referring to FIG. 11, the actual clock signals ICLK, NICLK1, and NICLK2 may be clock signals reflecting an internal environment (e.g., an internal temperature) of a semiconductor device (e.g., the second semiconductor device 120). A duty ratio of the clock signal CLK may be changed depending on factors such as the internal environment of the semiconductor device, operational duration and aging effects. The actual clock signals ICLK, NICLK1, and NICLK2 may include an ideal clock signal ICLK, a first non-ideal clock signal NICLK1, and a second non-ideal clock signal NICLK2. The actual clock signals ICLK, NICLK1, and NICLK2 may have the same frequency and period, although their duty ratios may differ. For the ideal clock signal ICLK, the first section HL1, which maintains a logic high level, and the second section LL1, which maintains a logic low level, may have equal durations. That is, a duty ratio of the ideal clock signal ICLK may be 50%. For the first non-ideal clock signal NICLK1, a first section HL2, which maintains the logic high level, may be longer than a second section LL2, which maintains the logic low level. That is, a duty ratio of the first non-ideal clock signal NICLK1 may be greater than 50%. For the second non-ideal clock signal NICLK2, a first section HL3, which maintains the logic high level, may be longer than a second section LL3, which maintains the logic low level. That is, a duty ratio of the second non-ideal clock signal NICLK2 may be less than 50%.

As described above, because the actual duty ratio of a clock signal may be less than or greater than 50%, a phase difference between clock signals (e.g., phase differences between the first and second internal clock signal pairs CLKI, CLKIB, CLKQ, and CLKQB), phase differences between the first and second track clock signal pairs LTCLKI, LTCLKIB, LTCLKQ, and LTCLKQB, and/or phase differences between the first and second data clock signal pairs LDCLKI, LDCLKIB, LDCLKQ, and LDCLKQB) may be different from the ideal phase difference PD. Accordingly, it may be difficult to accurately recalibrate clock skew.

Figure 12:
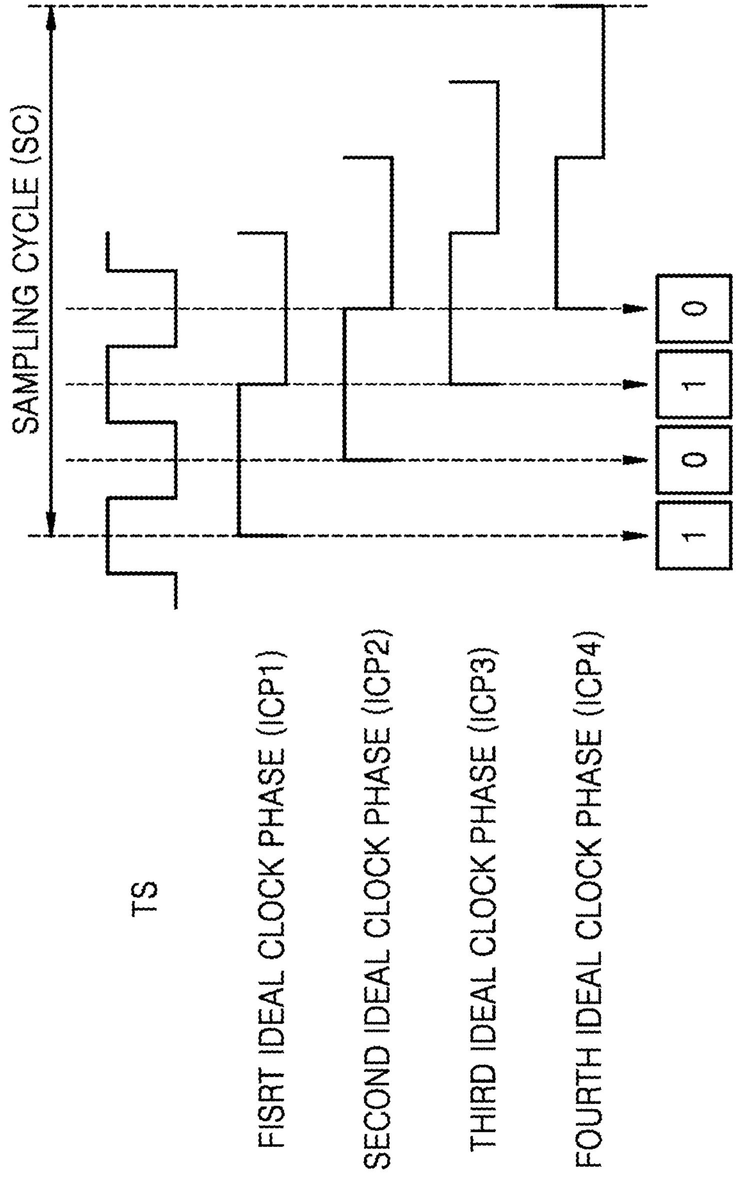
FIGS. 12, 13, and 14 are diagrams illustrating logic levels of a track signal sampled by ideal clock phases, according to the inventive concept.
Figure 13:
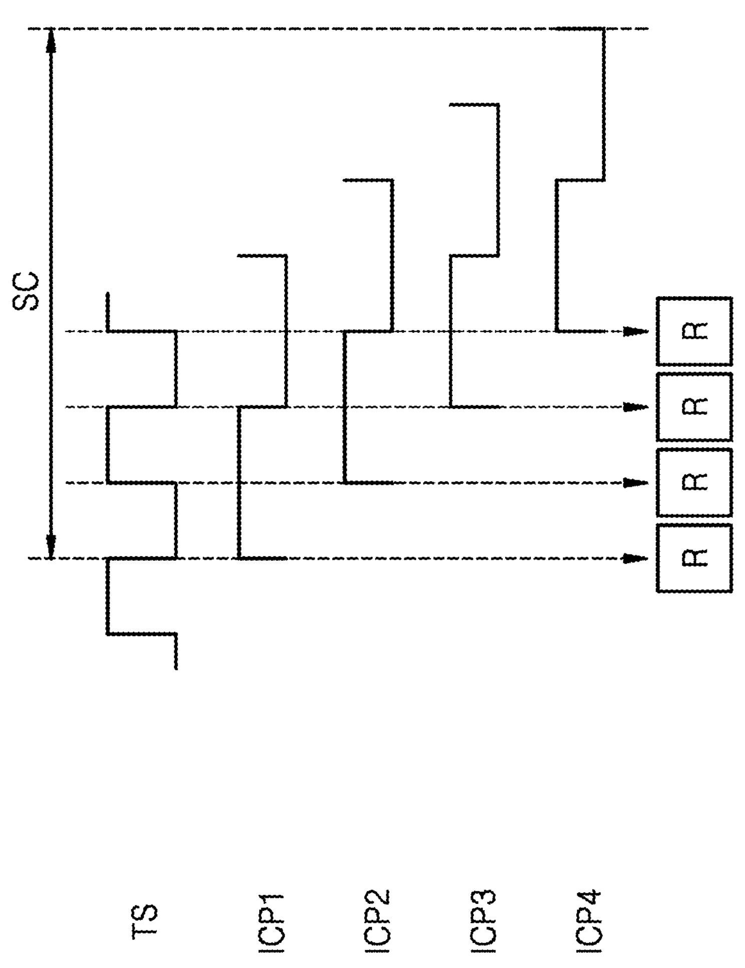
Figure 14:
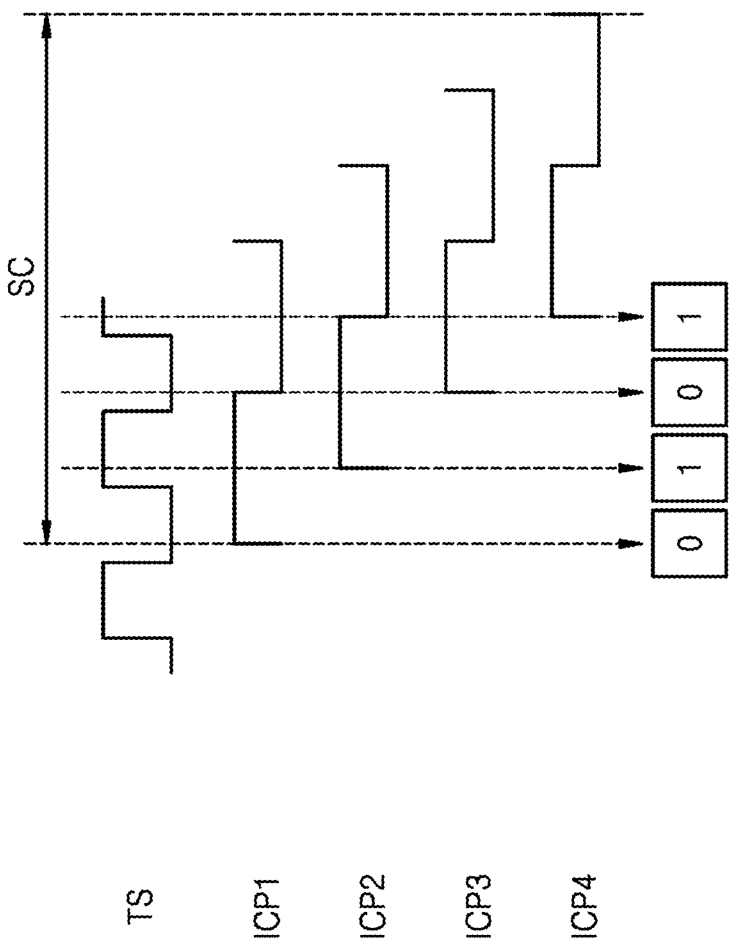

FIGS. 12, 13, and 14 are diagrams illustrating logic levels of the track signal TS sampled by first to fourth ideal clock phases ICP1, ICP2, ICP3, and ICP4 according to the inventive concept.

Referring to FIGS. 12, 13, and 14, an ideal clock phase according to the inventive concept may be an example of a period of an ideal clock signal to describe sampling a signal in synchronization with its rising edge. Phase differences between the first to fourth ideal clock phases ICP1, ICP2, ICP3, and ICP4 may each be 90 degrees as described above. In some embodiments, the first to fourth ideal clock phases ICP1, ICP2, ICP3, and ICP4 may correspond to the first and second internal clock signal pairs CLKI, CLKIB, CLKQ, and CLKQB and/or the first and second track clock signal pairs LTCLKI, LTCLKIB, LTCLKQ, and LTCLKQB. For example, the first ideal clock phase ICP1 may correspond to one period of the first track true signal LTCLKI, the second ideal clock phase ICP2 may correspond to one period of the second track true signal LTCLKQ, the third ideal clock phase ICP3 may correspond to one period of the first track complement signal LTCLKIB, and the fourth ideal clock phase ICP4 may correspond to one period of the second track complement signal LTCLKQB. A sampling cycle SC may include one period of each of the first and second internal clock signal pairs CLKI, CLKIB, CLKQ, and CLKQB and/or the first and second track clock signal pairs LTCLKI, LTCLKIB, LTCLKQ, and LTCLKQB. For example, the sampling cycle SC may include the first to fourth ideal clock phases ICP1, ICP2, ICP3, and ICP4. For example, the four phases (ICP1, ICP2, ICP3, and ICP4) collectively occur during the same period in which the sampling cycle (SC) takes place.

FIG. 12 illustrates an embodiment in which a rising edge of the first ideal clock phase ICP1 is located to the left of transition of the track signal TS (e.g., a logic level of the track signal TS is transitioned from a logic high level to a logic low level). Referring to FIG. 12, during one sampling cycle SC, the logic high level of the track signal TS may be sampled in response to the rising edge of the first ideal clock phase ICP1, the logic low level of the track signal TS may be sampled in response to a rising edge of the second ideal clock phase ICP2, the logic high level of the track signal TS may be sampled in response to a rising edge of the third ideal clock phase ICP3, and the logic low level of the track signal TS may be sampled in response to a rising edge of the fourth ideal clock phase ICP4. Accordingly, a digital signal corresponding to the track signal TS sampled during one sampling cycle SC may be "1010".

FIG. 13 illustrates an embodiment in which the rising edge of the first ideal clock phase ICP1 is located in the transition of the track signal TS. Referring to FIG. 13, the logic level of the track signal TS may be sampled in response to the rising edges of the first to fourth ideal clock phases ICP1, ICP2, ICP3, and ICP4 sequentially. When the transition of the track signal TS is sampled, the logic level of the sampled track signal TS may be any of the logic high level or the logic low level. That is, the logic level of the track signal TS sampled during one sampling cycle SC may be randomly sampled. The digital signal corresponding to the track signal TS sampled by the first to fourth ideal clock phases ICP1, ICP2, ICP3, and ICP4 during one sampling cycle SC may be "RRRRR". Here, "RRRRR" may be any random number among 16 cases from "0000" to "11111". For example, since in FIG. 13, all the points at which the track signal TS transition align the edges of the ideal clock phases, the sampled value at these points may be ambiguous and could be interpreted as either a logic high level or a logic low level.

FIG. 14 illustrates an embodiment in which the rising edge of the first ideal clock phase ICP1 is located to the right side of the transition of the track signal TS. Referring to FIG. 14, similarly to what was described above with reference to FIGS. 12 and 13, the digital signal corresponding to the track signal TS sampled by the first to fourth ideal clock phases ICP1, ICP2, ICP3, and ICP4 during one sampling cycle SC may be "0101".

FIG. 15 is a diagram illustrating a skew direction and an alignment status according to the number of times a specific logic level of the track signal TS is sampled by an ideal clock phase according to the inventive concept.

Referring to FIG. 15, the specific logic level of the track signal TS may be a logic high level. However, the inventive concept is not limited thereto. For example, the specific logic level of the track signal TS of the inventive concept may instead be a logic low level. Hereinafter, it is assumed that the specific logic level of the track signal TS is the logic high level. The first to fourth ideal clock phases ICP1, ICP2, ICP3, and ICP4 may respectively correspond to the first and second track clock signal pairs LTCLKI, LTCLKIB, LTCLKQ, and LTCLKQB.

A first number of times according to an embodiment may be the number of times the logic high level of the track signal TS is sampled by the first ideal clock phase ICP1 (see "A NUMBER OF "1" CAPTURED BY ICP1") and the number of times the logic high level of the track signal TS is sampled by the third ideal clock phase ICP3 (see "A NUMBER OF "1" CAPTURED BY ICP3"). For example, one sampler may detect a logic high level of the track signal TS a first number of times in synchronization with the first ideal clock phase ICP1 and another sampler may detect a logic high level of the track signal TS a first number of times in synchronization with the third ideal clock phase ICP3.

A second number of times according to an embodiment may be the number of times the logic high level of the track signal TS is sampled by the second ideal clock phase ICP2 (see "A NUMBER OF "1" CAPTURED BY ICP2") and the number of times the logic high level of the track signal TS is sampled by the fourth ideal clock phase ICP4 (see "A NUMBER OF "1" CAPTURED BY ICP4"). For example, one sampler may detect a logic high level of the track signal TS a second number of times in synchronization with the second ideal clock phase ICP2 and another sampler may detect a logic high level of the track signal TS a second number of times in synchronization with the fourth ideal clock phase ICP4.

The skew direction may refer to a direction in which the first to fourth ideal clock phases ICP1, ICP2, ICP3, and ICP4, for example, the ideal first and second track clock signal pairs LTCLKI, LTCLKIB, LTCLKQ, and LTCLKQB, shift or drift over time. The skew direction may indicate a first direction (e.g., a left direction), a second direction (e.g., a right direction), or an alignment status.

The controller 220 may detect the alignment status by detecting a point where the first number of times changes from "m" to "N11" (or "N13"), a point where the second number of times changes from "N12" (or "N14") to "m" a point where the first number of times changes from "N11" (or "N13") to "m" or a point where the second number of times changes from "m" to "N12" (or "N14").

Referring to FIG. 15, for example, it is assumed that initial locations of the first and second track clock signal pairs LTCLKI, LTCLKIB, LTCLKQ, and LTCLKQB (e.g., a rising edge of the first track true signal LTCLKI occurs at a location of the shift status "0") are set, and then, clock signals of the receiver 210 drift and the rising edge of the first track true signal LTCLKI is moved from the location of the shift status "0" to a location of the shift status "4".

In a first sampling phase, the controller 220 may obtain the first and second number of times in the shift status "4". The first number of times corresponding to the shift status "4" may be 0, and the second number of times may be m (i.e., the total number of repetitions of the sampling cycle SC). In this case, the controller 220 may detect that the skew direction corresponding to the shift status "4" is the right direction. In addition, the controller 220 may determine the shift direction as the left direction. For example, since the controller 220 detects that a clock signal has inadvertently shifted to the right, the controller 220 concludes it needs to be shifted to the left to correct the misalignment. In addition, the controller 220 may generate a clock shift signal CLKSFT indicating the left direction and a minimum unit shift magnitude (e.g., the value of the shift status changes from "4" to "3"). The first and second track clock signal pairs LTCLKI, LTCLKIB, LTCLKQ, and LTCLKQB may be shifted by one movement unit in FIG. 10 in the left direction.

In a second sampling phase, the controller 220 may obtain the first and second number of times. At this time, the first and second number of times may be the same as the number of times corresponding to the shift status "3", that is, the first and second number of times in the first sampling phase. In this case, the controller 220 may detect that the skew direction is the right direction. Therefore, the controller 220 may generate the clock shift signal CLKSFT indicating the left direction and the shift magnitude of one moving unit in the same manner as the first sampling phase. The first and second track clock signal pairs LTCLKI, LTCLKIB, LTCLKQ, and LTCLKQB may be shifted by one movement unit of FIG. 10 in the left direction (e.g., the value of the shift status changes from "3" to "2").

A third sampling phase proceeds in the same manner, and the first and second track clock signal pairs LTCLKI, LTCLKIB, LTCLKQ, and LTCLKQB may be shifted by one movement unit of FIG. 10 in the left direction (e.g., the value of the shift status changes from "2" to "1").

In a fourth sampling phase, the controller 220 may obtain the first and second number of times. The first number of times may be N11 (and/or N13), and the second number of times may be N12 (and/or N14). At this time, N11, N12, N13, and N14 are arbitrary or random numbers, as described above with reference to FIG. 13, and may be almost the same to the extent that differences therebetween are very small.

Finally, just as the value of the shift status changes from "4" to "1", the first and second track clock signal pairs LTCLKI, LTCLKIB, LTCLKQ, and LTCLKQB may be shifted in the left direction by three times the movement unit of FIG. 10. Accordingly, as shown in FIG. 6, the track signal TS and the first and second track clock signal pairs LTCLKI, LTCLKIB, LTCLKQ, and LTCLKQB may become aligned with each other.

FIGS. 16, 17, 18, 19, and 20 are diagrams illustrating logic levels of the track signal TS sampled by actual clock phases ICP1, NICP1, ICP3, and NICP2 according to the inventive concept.

Referring to FIGS. 16, 17, 18, 19, and 20, the actual clock phases ICP1, NICP1, ICP3, and NICP2 may include ideal clock phases and/or non-ideal clock phases. For example, the actual clock phases ICP1, NICP1, ICP3, and NICP2 may include the first and third ideal clock phases ICP1 and ICP3 of FIGS. 12 to 14. In addition, the actual clock phases ICP1, NICP1, ICP3, and NICP2 may include the first and second non-ideal clock phases NICP1 and NICP2 instead of the second and fourth ideal clock phases ICP2 and ICP4 of FIGS. 12 to 14. However, the inventive concept is not limited to the above-described example. The first non-ideal clock phase NICP1 may be a signal having a duty ratio greater than a duty ratio (e.g., 50%) of the second ideal clock phase ICP2, and the second non-ideal clock phase NICP2 may be a signal having a duty ratio greater than a duty ratio of the fourth ideal clock phase ICP4. It is assumed that the first and second non-ideal clock phases NICP1 and NICP2 according to an embodiment correspond to one cycle of the first non-ideal clock signal NICLK1 of FIG. 11. In some embodiments, the actual clock phases ICP1, NICP1, ICP3, and NICP2 may respectively correspond to the first and second internal clock signal pairs CLKI, CLKIB, CLKQ, and CLKQB and/or the first and second track clock signal pairs LTCLKI, LTCLKIB, LTCLKQ, and LTCLKQB. The sampling cycle SC may include the actual clock phases ICP1, NICP1, ICP3, and NICP2.

Figure 16:
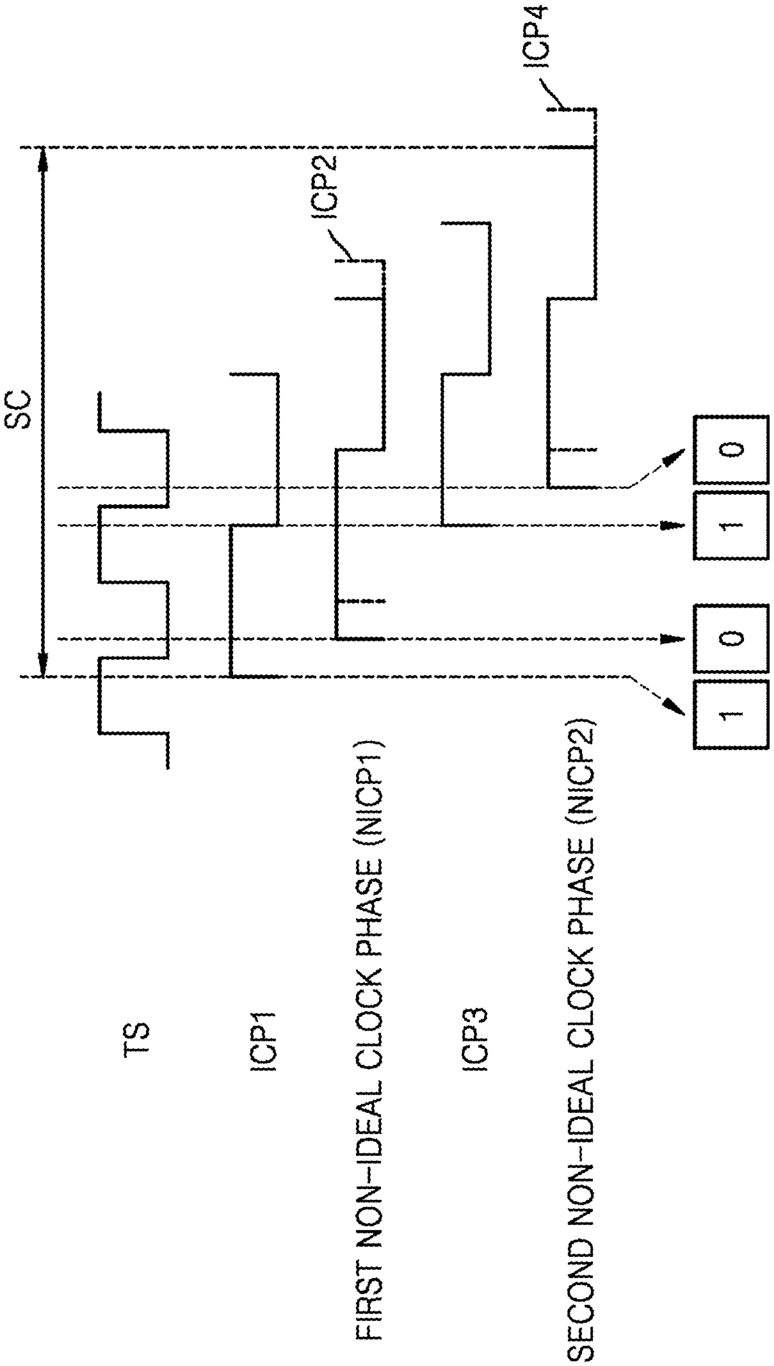
FIGS. 16, 17, 18, 19, and 20 are diagrams illustrating logic levels of a track signal sampled by actual clock phases, according to the inventive concept.

FIG. 16 illustrates an embodiment in which a rising edge of the first ideal clock phase ICP1 is located to the left of transition of the track signal TS. Referring to FIG. 16, as shown in FIG. 12, a digital signal corresponding to the track signal TS sampled during one sampling cycle SC may be "1010".

Figure 17:
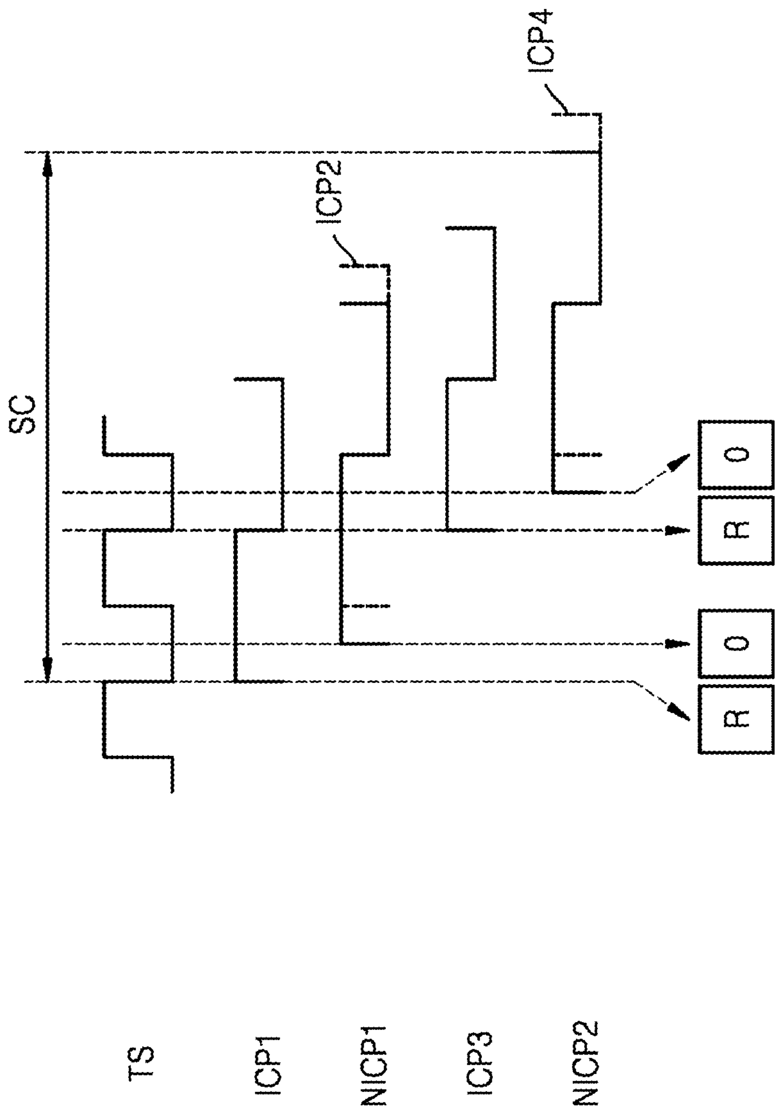

FIG. 17 illustrates an embodiment in which the rising edge of the first ideal clock phase ICP1 is located at the transition of the track signal TS. Referring to FIG. 17, the digital signal corresponding to the track signal TS sampled during one sampling cycle SC may be "R0R0". Here, "R0R0" may be any random one of "0000", "1000", "0010", and "1010".

Figure 18:
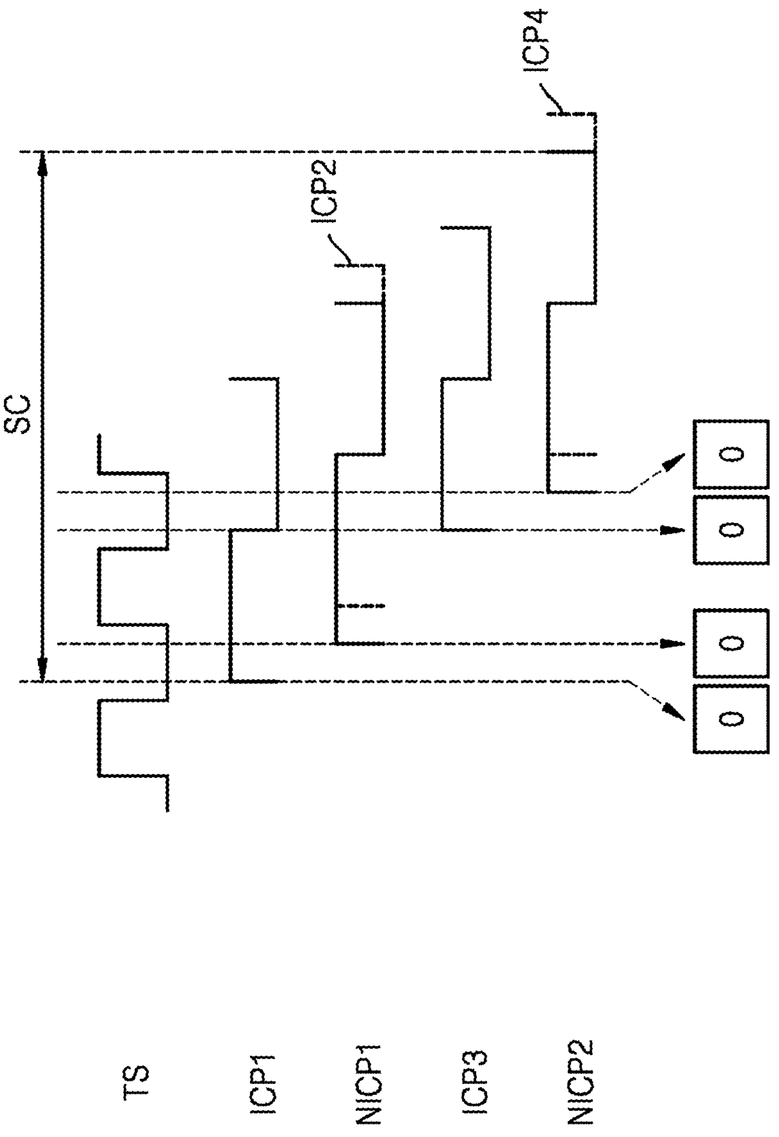

FIG. 18 illustrates an embodiment in which the rising edge of the first ideal clock phase ICP1 is located to the right of the transition of the track signal TS. Referring to FIG. 18, the digital signal corresponding to the track signal TS sampled during one sampling cycle SC may be "0000".

Figure 19:
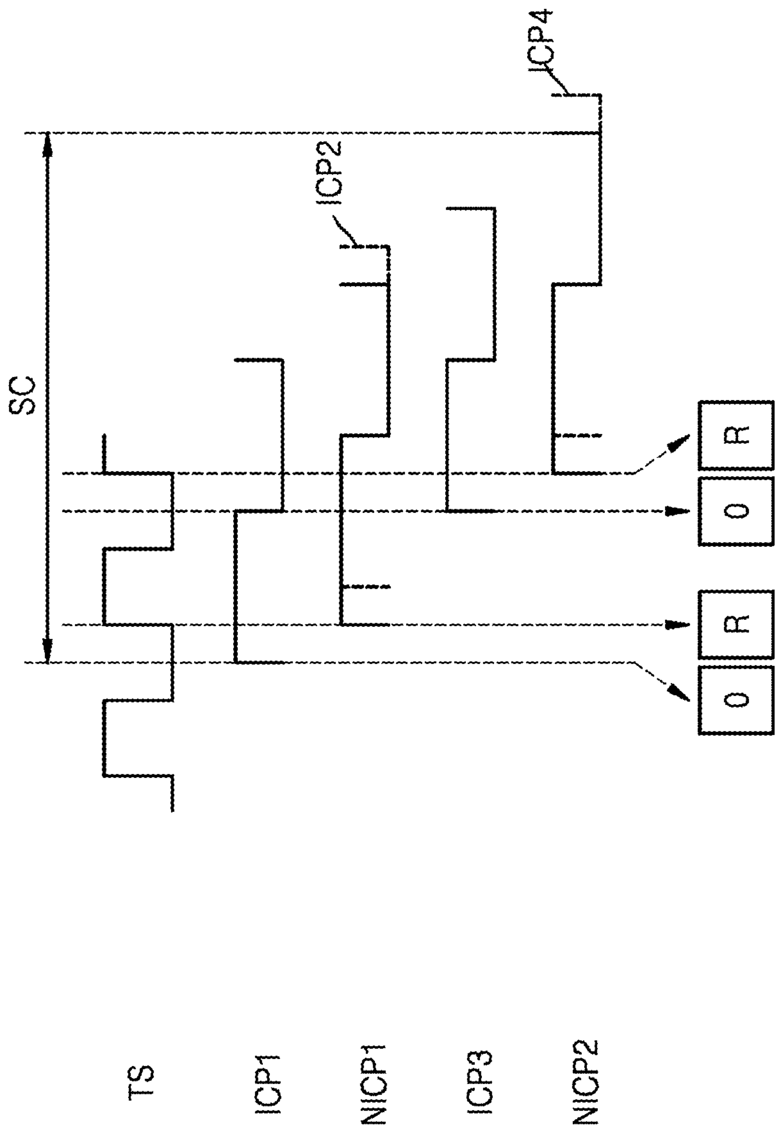

FIG. 19 illustrates an embodiment in which rising edges of the first and second non-ideal clock phases NICP1 and NICP2 are located at the transition of the track signal TS. Referring to FIG. 17, a digital signal corresponding to the track signal TS sampled by the actual clock phases ICP1, NICP1, ICP3, and NICP2 during one sampling cycle SC may be "0R0R". Here, "0R0R" may be any random one of "0000", "0100", "0000", and "0101".

Figure 20:
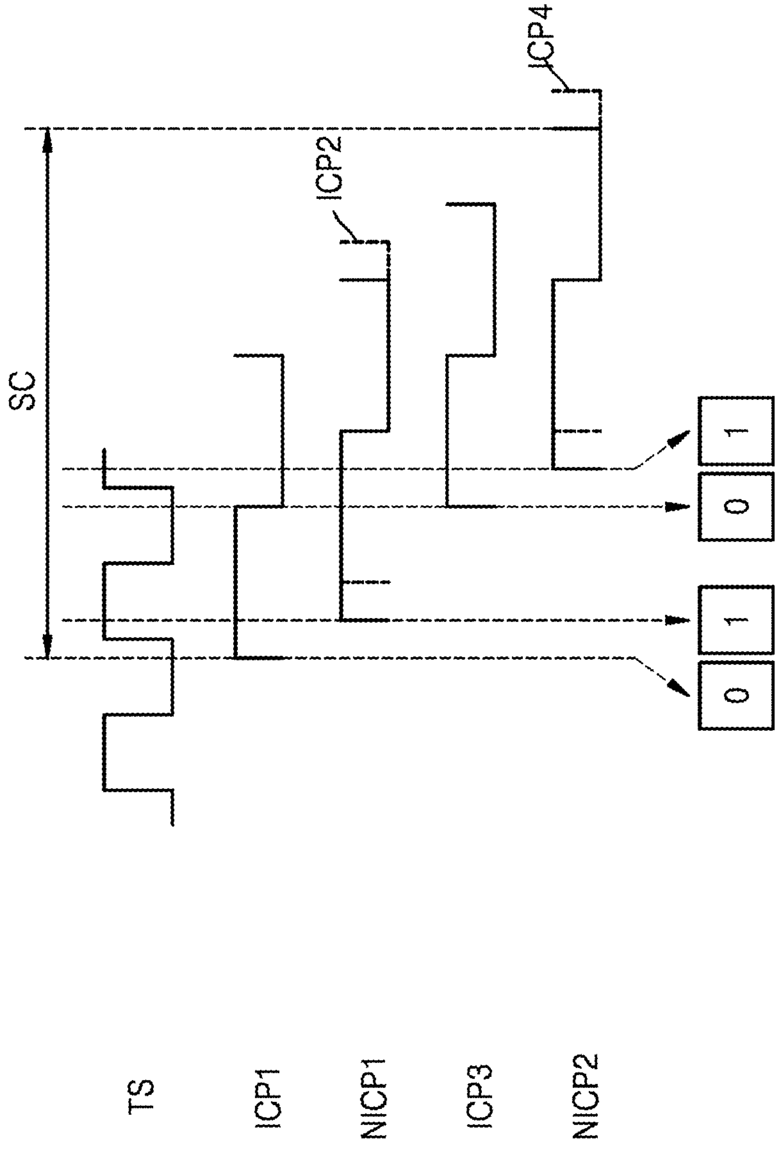

FIG. 20 illustrates an embodiment in which the rising edges of the first and third ideal clock phases ICP1 and ICP3 are located to the left of the transition of the track signal TS, and the rising edges of the first and second non-ideal clock phases NICP1 and NICP2 are located to the right of the transition of the track signal TS. Referring to FIG. 20, the digital signal corresponding to the track signal TS sampled during one sampling cycle SC may be "0101".

FIG. 21 is a diagram illustrating a skew direction and an alignment possible status (APS) according to the number of times a specific logic level of the track signal TS is sampled by an actual clock phase according to the inventive concept. For example, FIG. 21 may illustrate illustrating a skew direction and an alignment possible status (APS) according to the number of times a specific logic level of the track signal TS is sampled in synchronization with the actual clock phase.

Referring to FIG. 21, it is assumed that the specific logic level of the track signal TS is a logic high level. The first to fourth clock phases CP1, CP2, CP3, and CP4 may respectively correspond to the actual first and second track clock signal pairs LTCLKI, LTCLKIB, LTCLKQ, and LTCLKQB. For example, the first to fourth clock phases CP1, CP2, CP3, and CP4 may be the actual clock phases ICP1, NICP1, ICP3, and NICP2 as shown in FIGS. 16 to 20. However, the inventive concept is not limited to the above-described example.

A first number of times according to an embodiment may be the number of times the logic high level of the track signal TS is sampled by the first ideal clock phase ICP1 (see "A NUMBER OF "1" CAPTURED BY CP1) and the number of times the logic high level of the track signal TS is sampled by the third ideal clock phase ICP3 (see "A NUMBER OF "1" CAPTURED BY CP3). For example, the first number of times may be the number of times the logic high level of the track signal TS is sampled by one sampler in synchronization with CP1 and the number of times the logic high level of the track signal TS is sampled by another sampler in synchronization with CP3.

A second number of times according to an embodiment may be the number of times the logic high level of the track signal TS is sampled by the second clock phase CP2 (e.g., "A NUMBER OF "1" CAPTURED BY CP2) and the number of times the logic high level of the track signal TS is sampled by the fourth clock phase CP4 (e.g., "A NUMBER OF "1" CAPTURED BY CP4). For example, the second number of times may be the number of times the logic high level of the track signal TS is sampled by one sampler in synchronization with CP2 and the number of times the logic high level of the track signal TS is sampled by another sampler in synchronization with CP4.

In some embodiments, the controller 220 may count the first number of times and the second number of times based on the track samples of the track signal TS for each sampling phase. One sampling phase may be a section in which the sampling cycle SC is repeated m times, where m is a natural number. An embodiment in which the first and second number of times are counted is the same as described above with reference to FIG. 15. The controller 220 may compare the first number of times with a first reference number of times TH1 and compare the second number of times with a second reference number of times TH2, for each sampling phase. The controller 220 may determine a skew direction of a skew status for each sampling phase based on a first comparison between the first number of times and the first reference number of times TH1 and a second comparison between the second number of times and the second reference number of times TH2. Based on a previous skew direction in a previous sampling phase and a current skew direction in a current sampling phase, the controller 220 may determine boundaries of a shift range that create the APS (e.g., possible alignment) between the track signal TS and the first and second internal clock signal pairs CLKI, CLKIB, CLKQ, and CLKQB.

In an embodiment, when a result of the first comparison indicates that the first number of times is greater than the first reference number of times TH1, the controller 220 may detect a first skew direction, for example, a left direction. When a result of the second comparison indicates that the second number of times is greater than the second reference number of times TH2, the controller 220 may detect a second skew direction opposite to the first skew direction, for example, a right direction. When the result of the first comparison indicates that the first number of times is less than or equal to the first reference number of times TH1, and the result of the second comparison indicates that the second number of times is less than or equal to the second reference number of times TH2, the controller 220 may detect that the track signal TS and the first and second internal clock signal pairs CLKI, CLKIB, CLKQ, and CLKQB are in the APS (or possibly aligned).

In an embodiment, the controller 220 may determine a first shift direction opposite to the first skew direction or a second shift direction opposite to the second skew direction.

In an embodiment, when the first skew direction is detected in the previous sampling phase and the APS is detected in the current sampling phase, the controller 220 may determine a first boundary, for example, a left boundary LB. The left boundary LB may be a boundary of a shift range in which the first number of times satisfies the number of "N21" (and/or "N22") less than or equal to the first reference number of times TH1. Here, "N21" and "N22" may be the same or substantially the same number. A right boundary RB may be a boundary of a shift range in which the second number of times satisfies the number of "N23" (and/or "N24") less than or equal to the second reference number of times TH2. Here, "N23" and "N24" may be the same or substantially the same number. When the first skew direction is detected in the previous sampling phase and the APS is detected in the current sampling phase, the controller 220 may determine a second boundary, for example, the right boundary RB. The controller 220 may determine a shift magnitude and a shift direction satisfying a shift range between the first boundary and the second boundary.

In an embodiment, the controller 220 may detect the first boundary (e.g., the left boundary LB) by detecting a point where the first number of times changes from "m" to "N21" (or "N22") or a point where the first number of times changes from "N21" (or "N22") to "m". The controller 220 may detect the alignment status by detecting a point where the second number of times changes from "N23" (or "N24") to "m" or a point where the second number of times changes from "m" to "N23" (or "N24").

Referring to FIG. 21, for example, it is assumed that initial locations of the first and second track clock signal pairs LTCLKI, LTCLKIB, LTCLKQ, and LTCLKQB (e.g., a rising edge of the first track true signal LTCLKI occurs at a location of the shift status "0") are set, and then, clock signals of the receiver 210 drift and the rising edge of the first track true signal LTCLKI is located at the shift status "4".

As described above with reference to FIG. 15, the first sampling phase may correspond to the shift status "4". That is, the first number of times may be 0, and the second number of times may be m. The sampling phase may be repeated until the controller 220 detects the right boundary RB. It is assumed that the right boundary RB is the shift status "2". In this case, the change of the shift status from "4" to "2" (see "MOVE−2 (FOR LB)" in FIG. 21) means that the rising edge of the first track true signal LTCLKI is moved from the location of "4" in the left direction by twice (e.g., 2 columns) the movement unit of FIG. 10. That is, it may be confirmed that the controller 220 shifts the first and second track clock signal pairs LTCLKI, LTCLKIB, LTCLKQ, and LTCLKQB by twice the movement unit of FIG. 10 in the left direction. In the same way, the sampling phase may be repeated until the controller 220 detects the left boundary LB. It is assumed that the left boundary LB is "−1" of the shift status. In this case, the change of the shift status from "4" to "−1" (see "MOVE−5 (FOR LB)" in FIG. 21) means that the rising edge of the first track true signal LTCLKI is five times (e.g., five columns) the movement unit of FIG. 10 in the left direction. That is, the controller 220 may confirm that the first and second track clock signal pairs LTCLKI, LTCLKIB, LTCLKQ, and LTCLKQB are shifted by five times the movement unit of FIG. 10 in the left direction. The average of the number of movements to the right boundary RB (e.g., movement of two columns in the left direction or "−2") and the number of movements to the left boundary LB (e.g., movement of five column in the left direction or "−5") may correspond to the number of movements to the APS. For example, the number of movements to the APS may be 3.5 columns of movement in the left direction (e.g., "(−2-5)/2"). At this time, a decimal point may be rounded up or truncated. For example, "−3.5" may be truncated to derive a result of "−3". Accordingly, the controller 220 may detect the APS by shifting the first and second track clock signal pairs LTCLKI, LTCLKIB, LTCLKQ, and LTCLKQB by three times the movement unit of FIG. 10 in the left direction.

Figure 22:
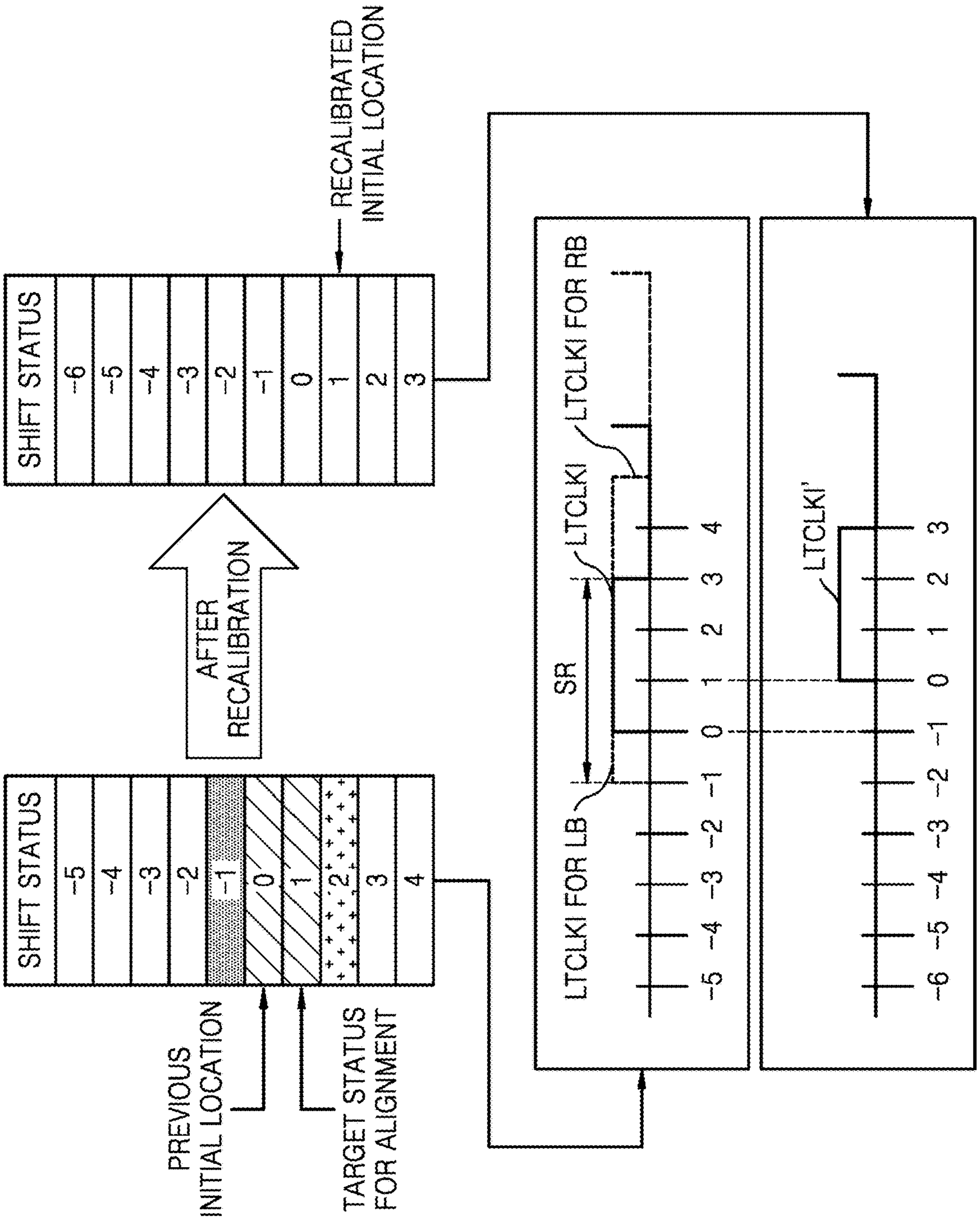
FIG. 22 is a diagram illustrating an initial location of a clock signal before and after recalibration, according to the inventive concept.

FIG. 22 is a diagram illustrating an initial location of a clock signal before and after recalibration according to the inventive concept.

Referring to FIG. 22, previous initial locations of clock signals (e.g., the first and second track clock signal pairs LTCLKI, LTCLKIB, LTCLKQ, and LTCLKQB) may be set in the shift status before recalibration, as described with reference to FIG. 21. Referring to FIG. 22, for example, the previous initial location of the first track true signal LTCLKI may indicate that a rising edge occurs at a location of the shift status "0". The location of the first track true signal LTCLKI FOR LB with respect to the left boundary LB may indicate that the rising edge occurs at a location of the shift status "−1". A location of the first track true signal LTCLKI with respect to the right boundary RB may indicate that the rising edge occurs at a location of the shift status "2". A shift range SR may be range between a location of the first track true signal LTCLKI with respect to the left boundary LB and the location of the first track true signal LTCLKI with respect to the right boundary RB. When the first and second track clock signal pairs LTCLKI, LTCLKIB, LTCLKQ, and LTCLKQB are shifted so that the rising edge of the first track true signal LTCLKI is included within the shift range SR, the first track true signal LTCLKI, the first track complement signal LTCLKIB, the second track true signal LTCLKQ, the second track complement signal LTCLKQB, and the track signal TS may be in the APS. Referring to FIGS. 21 and 22, for example, a target status for alignment may be determined as the shift status "1".

In the shift status after recalibration, recalibrated initial locations of the clock signals (e.g., the first and second track clock signal pairs LTCLKI, LTCLKIB, LTCLKQ, and LTCLKQB) may be determined. In this case, a value of the shift status of the recalibrated initial location may be initialized, and for example, the shift status with respect to a target status for alignment before recalibration may be changed from "1" to "0". The location of the shift status "1" before recalibration may be the same as the location of the shift status "0" after recalibration. According to the recalibrated initial location, a rising edge of a recalibrated first track true signal LTCLKI' may occur at the location of the shift status "0".

Figure 23:
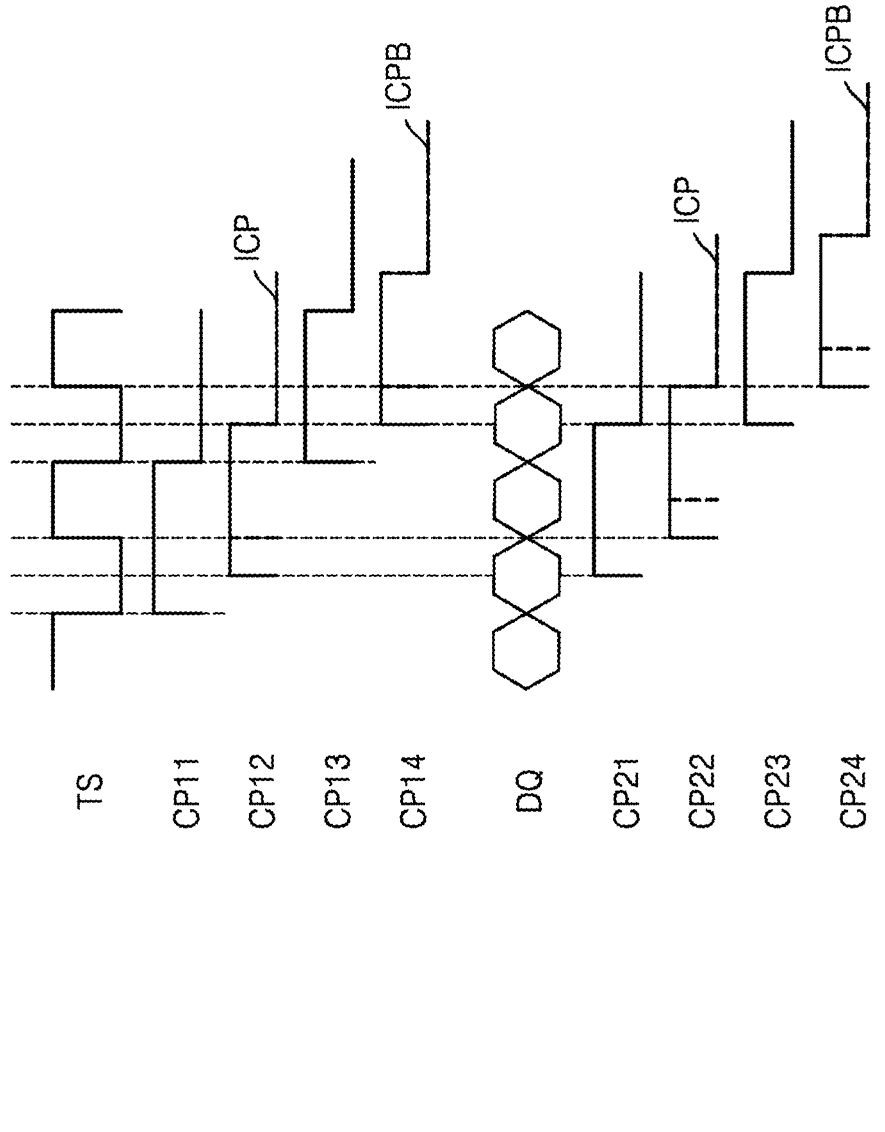
FIG. 23 is a diagram illustrating clock phases shifted according to a first boundary or a second boundary according to the inventive concept.
Figure 24:
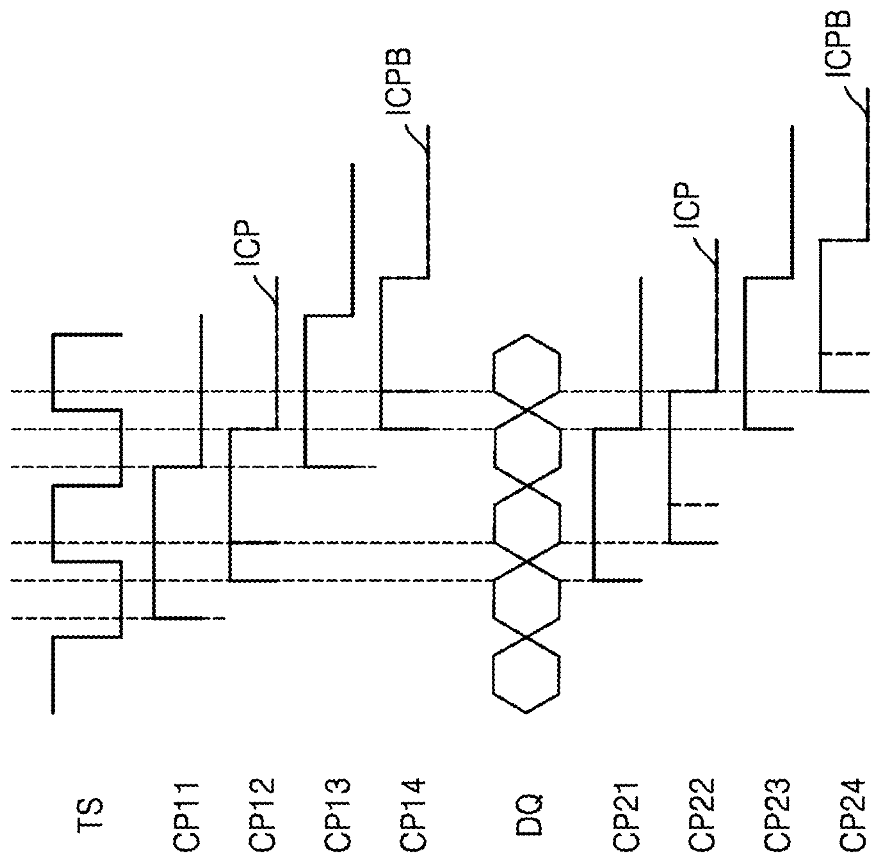
FIG. 24 is a diagram illustrating clock phases shifted by a shift range between a first boundary and a second boundary, according to the inventive concept.

FIG. 23 is a diagram illustrating clock phases CP11, CP12, CP13, and CP14 and complementary clock phases CP21, CP22, CP23, and CP24 shifted according to a first boundary or a second boundary according to the inventive concept. FIG. 24 is a diagram illustrating the clock phases CP11, CP12, CP13, and CP14 and the complementary clock phases CP21, CP22, CP23, and CP24 shifted by a shift range between the first boundary and the second boundary according to the inventive concept.

Referring to FIGS. 23 and 24, it is assumed that the two clock phases CP12 and CP14 have a duty ratio different from that of complementary ideal clock phases ICP and ICPB. For example, as described above with reference to FIGS. 16 to 20, the duty ratio of the two clock phases CP12 and CP14 may be greater than 50%.

Referring to FIG. 23, the clock phases CP11, CP12, CP13, and CP14 may be shifted based on one of the first boundary and the second boundary. Accordingly, the data signal DQ may be sampled in synchronization with rising edges of the complementary clock phases CP21 and CP23. However, because rising edges of the other complementary clock phases CP22 and CP24 are aligned with a transition of the data signal DQ, the data signal DQ may not be accurately sampled in synchronization with the rising edges of the other complementary clock phases CP22 and CP24. That is, the data signal DQ and the complementary clock phases CP21, CP22, CP23, and CP24 may be misaligned.

On the other hand, referring to FIG. 24, the clock phases CP11, CP12, CP13, and CP14 may be shifted based on the shift range SR between the first boundary and the second boundary. In this case, the rising edges of the clock phases CP21, CP22, CP23, and CP24 may be synchronized outside the transition of the data signal DQ. Accordingly, the data signal DQ and the complementary clock phases CP21, CP22, CP23, and CP24 may be aligned so that the data signal DQ may be stably sampled by the complementary clock phases CP21, CP22, CP23, and CP24.

Figure 25:
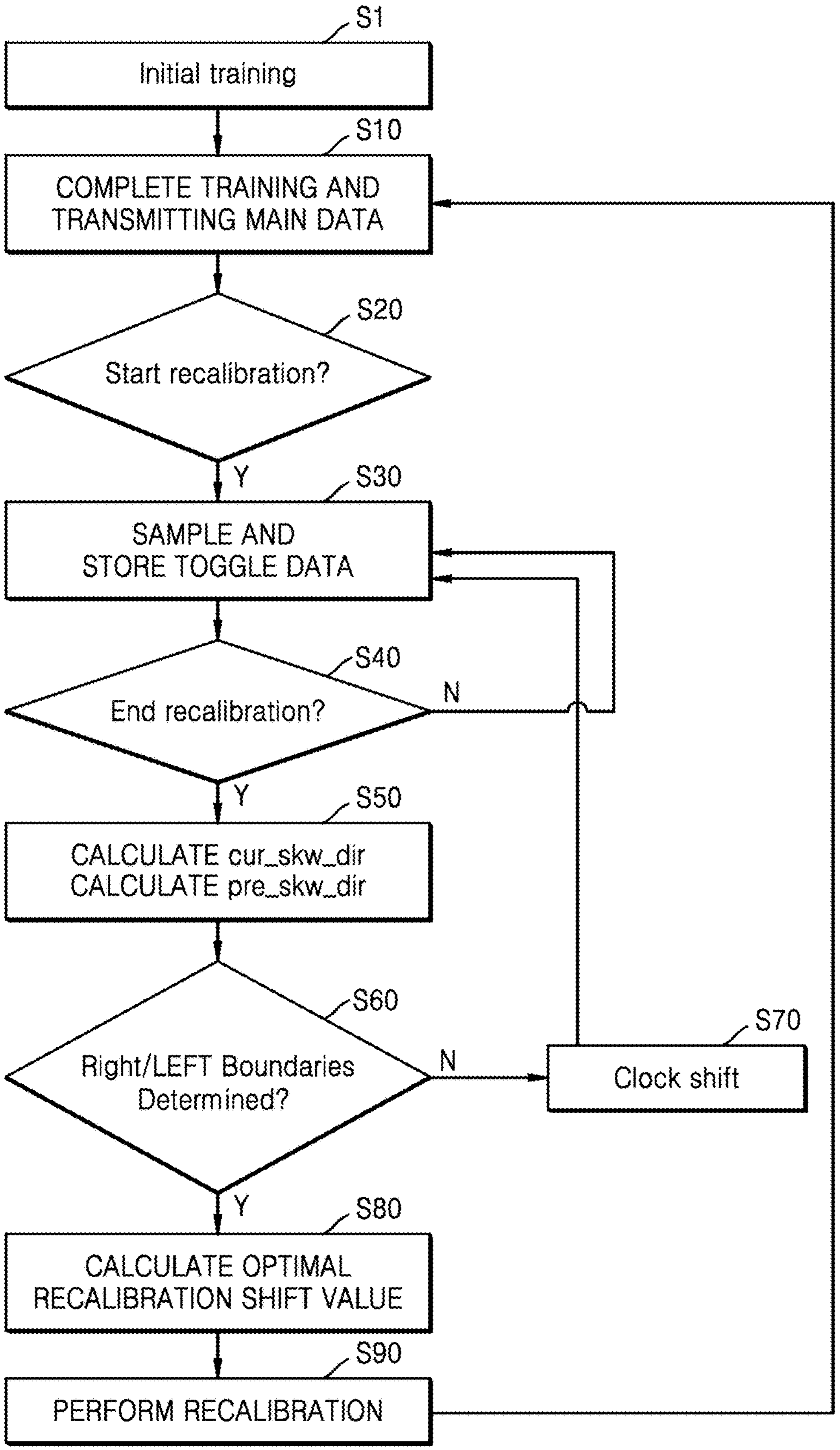
FIG. 25 is a flowchart illustrating an operating method of a controller, according to an embodiment.

FIG. 25 is a flowchart illustrating an operating method of the controller 122 according to an embodiment.

Referring to FIG. 25, in operation S1, the controller 122 may perform an initial training operation. The initial training operation may refer to a training operation related a D2D interface, performed while the semiconductor system 100 is in an initialized state. When the initial training operation is performed, phases of the first and second track clock signal pairs LTCLKI, LTCLKIB, LTCLKQ, and LTCLKQB may be shifted such that rising edges of the first and second track clock signal pairs LTCLKI, LTCLKIB, LTCLKQ, and LTCLKQB are aligned to a transition section of the track signal TS.

In operation S10, the controller 122 may transmit main data after completing the initial training operation. The main data may be, for example, the digital signals DSs of FIG. 1.

In operation S20, the controller 122 may determine whether to start a recalibration operation. For example, when a start condition of the recalibration operation is satisfied, the controller 122 may start the recalibration. At this time, the main data may be continuously transmitted to the controller 122. While the controller 122 performs the recalibration operation, the controller 122 may receive the main data and process the main data. That is, the controller 122 may perform an operation of processing the main data and perform the recalibration operation in parallel. In an embodiment, a certain section may be set in the controller 122, and the controller 122 may start the recalibration operation for each certain section. Additionally or alternatively, the sensor 123 implemented as a temperature sensor may provide the sensing signal SEN including a sensing value of an internal temperature to the controller 122. When the internal temperature is greater than or equal to a reference temperature, the controller 122 may initiate an operation of detecting a skew status during the recalibration operation.

In operation S30, the controller 122 may sample toggle data to generate samples and store the samples as sampled toggle data. For example, the controller 122 may begin sampling the toggle data upon starting the recalibration operation. In an embodiment, the toggle data corresponds to the track signal TS. Operation S30 may correspond to the embodiments described above with reference to FIGS. 12 to 21.

In operation S40, the controller 122 may determine whether to end the recalibration operation. For example, the controller 122 may end the recalibration operation when an end condition of the recalibration operation is satisfied while storing the samples of the sampled toggle data. Here, the end condition of the recalibration operation may be, for example, that one sampling phase has completed its sampling. The end condition of the recalibration operation may be that a sampling cycle of the sampling phase has been repeated m times.

In operation S50, the controller 122 may calculate a previous skew direction pre_skw_dir in a previous sampling phase and a current skew direction cur_skw_dir in a current sampling phase. Operation S50 may correspond to the embodiments described above with reference to FIG. 21.

In operation S60, the controller 122 may check whether the left boundary LB and the right boundary RB have been determined. For example, the controller may compare the previous skew direction pre_skew_dir with the current skew direction cur_skew_dir, and a result of the comparison may indicate whether the left boundary LB and the right boundary RB have been determined. Operation S60 may correspond to the embodiments described above with reference to FIG. 21.

In operation S70, the controller 122 may control the receiver 121 to shift clocks (e.g., the first and second track clock signal pairs LTCLKI, LTCLKIB, LTCLKQ, and LTCLKQ) and resume to operation S30 when the result of the comparison indicates the left boundary LB and the right boundary RB have not been determined.

In operation S80, the controller 122 may calculate an optimal recalibration shift value. For example, the controller 122 may calculate the optimal recalibration shift value when the result of the comparison indicates left boundary LB and the right boundary RB have been determined. The optimal recalibration shift value may be a value resulting from calculating an average of the number of movements to the right boundary RB and the number of movements to the left boundary LB described above with reference to FIG. 21, and rounding up a decimal point of the average.

In operation S90, the controller 122 may recalibrate a clock signal by using the optimal recalibration shift value. After completing operation S90, the controller 122 may resume to operation S10 to transmit additional main data.

Figure 26:
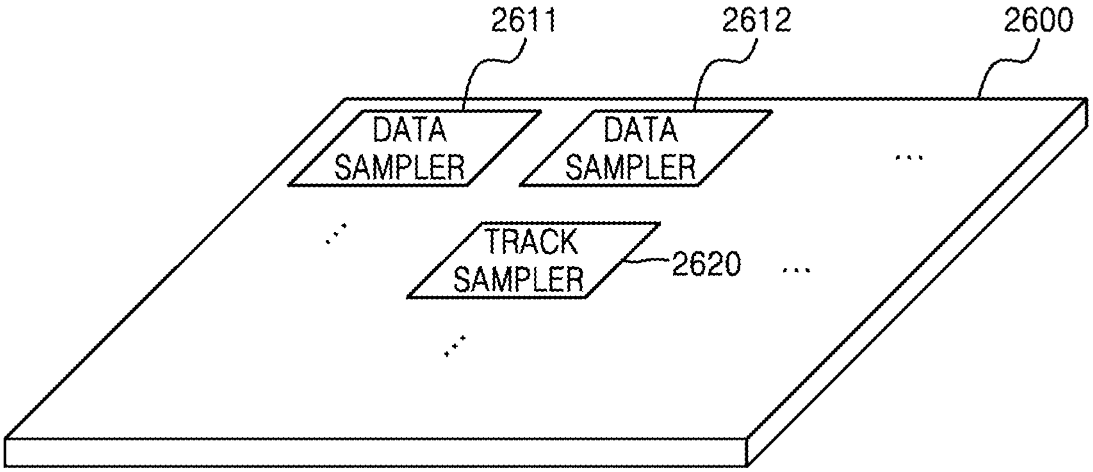
FIG. 26 is a diagram illustrating locations of samplers in a receiver, according to an embodiment.

FIG. 26 is a diagram illustrating locations of samplers in a receiver 2600 according to an embodiment.

Referring to FIG. 26, the receiver 2600 may include a plurality of data samplers 2611 and 2612 and a single track sampler 2620. For example, the plurality of data samplers 2611 and 2612 may correspond to or be included in the samplers 212_0 to 212_*n*−2 of FIG. 2.

The single track sampler 2620 may be located close to the center of the receiver 2600. The plurality of data samplers 2611 and 2612 may be located around the single track sampler 2620. That is, the single track sampler 2620 may be located closer to the center of the receiver 2600 than the locations of the plurality of data samplers 2611 and 2612. The single track sampler 2620 may receive data samples from the plurality of data samplers 2611 and 2612. Accordingly, an internal temperature of the single track sampler 2620 may be relatively higher than internal temperatures of the plurality of data samplers 2611 and 2612. Accordingly, the first and second track clock signal pairs LTCLKI, LTCLKIB, LTCLKQ, and LTCLKQB and the first and second data clock signal pairs LDCLKI, LDCLKIB, LDCLKQ, and LDCLKQB may drift with different magnitudes based on different internal temperatures.

In addition, the internal temperature of each of the plurality of data samplers 2611 and 2612 may be different according to the location of each of the plurality of data samplers 2611 and 2612. The first and second data clock signal pairs LDCLKI, LDCLKIB, LDCLKQ, and LDCLKQB for each data sampler may drift with different magnitudes.

Figure 27:
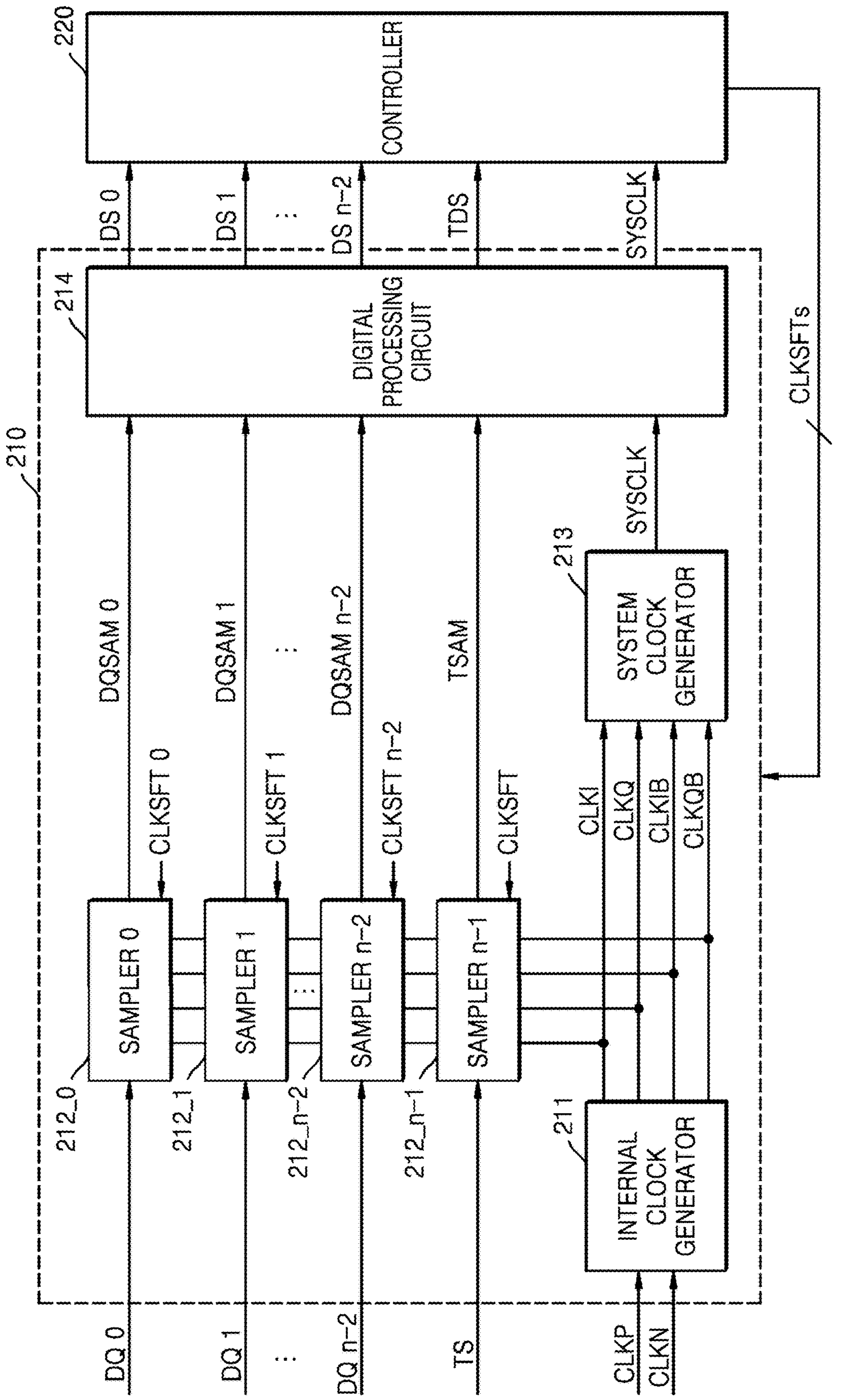
FIGS. 27 and 28 are block diagrams of a receiver and a controller, according to some embodiments.
Figure 28:
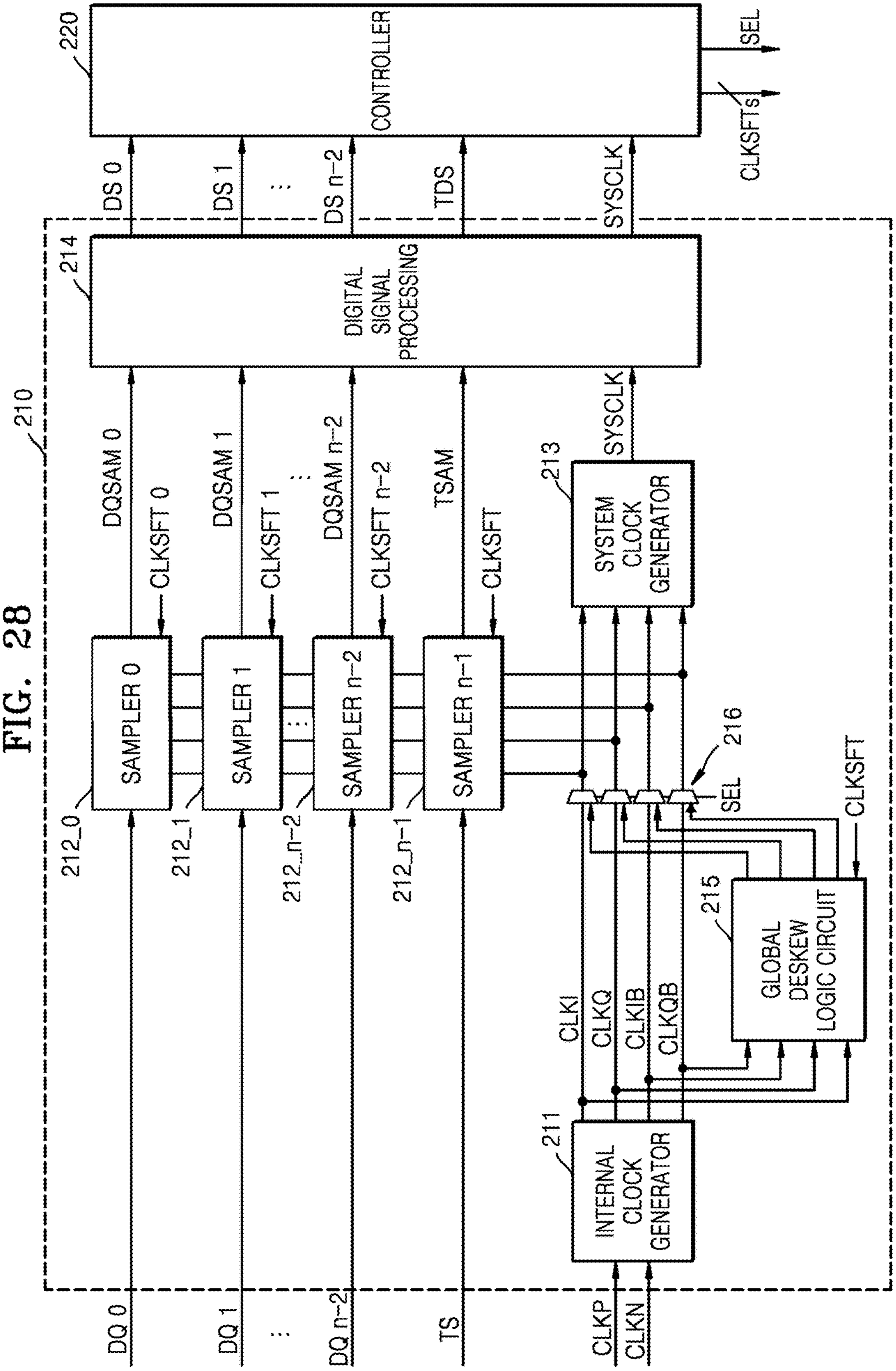

FIGS. 27 and 28 are block diagrams of the receiver 210 and the controller 220 according to some embodiments.

Referring to FIG. 27, as described above with reference to FIG. 2, the receiver 210 may include the internal clock generator 211, the plurality of samplers 212_0 to 212_*n*−1, the system clock generator 213, and the digital processing circuit 214. In some embodiments, the controller 220 of FIG. 27 may generate a plurality of clock shift signals CLKSFTs. The plurality of clock shift signals CLKSFTs may include shift magnitudes determined based on internal temperatures of the samplers 212_0 to 212_*n*−1 for each location as described above with reference to FIG. 26, and may include the same shift directions. One sampler 212_*n*−1 may receive one clock shift signal CLKSFT and the other samplers 212_0 to 212_*n*−2 may receive other clock shift signals CLKSFT0 to CLKSFTn−2. When the one sampler 212_*n*−1 is a track sampler for sampling the track signal TS, because the internal temperature of one sampler 212_*n*−1 may be greater than the internal temperatures of the other samplers 212_0 to 212_*n*−2, the shift magnitude of the one clock shift signal CLKSFT may be greater than the shift magnitude of each of the other clock shift signals CLKSFT0 to CLKSFTn−2. Accordingly, the performance and reliability of a device may be increased.

Referring to FIG. 28, because the internal clock signal pairs LTCLKI, LTCLKIB, LTCLKQ, LTCLKQB, LDCLKI, LDCLKIB, LDCLKQ, and LDCLKQB of the plurality of samplers 212_0 to 212_*n*−1 are generated based on the first and second internal clock signal pairs CLKI, CLKIB, CLKQ, and CLKQB, when the first and second internal clock signal pairs CLKI, CLKIB, CLKQ, and CLKQB drift, the clock signal pairs LTCLKI, LTCLKIB, LTCLKQB, LTCLKQB, LTCLKKI, LDCLKIB, LDCLKIB, LDCLKQB also drift. Thus, when the first and second internal clock signal pairs CLKI, CLKIB, CLKQ, and CLKQB are globally shifted, the local clock signal pairs LTCLKI, LTCLKIB, LTCLKQ, LTCLKQB, LDCLKIB, LDCLKIB, LDCLKQ, and LDCLKQB may also be aligned. Accordingly, the performance of a device, such as operation speed and operation efficiency, may be increased.

In some embodiments, the receiver 210 may further include global deskew logic circuit 215 and selectors 216. The selectors 216 may include selector circuits or multiplexers. The controller 220 may output the plurality of clock shift signals CLKSFTs and a selection signal SEL. The global deskew logic circuit 215 may shift phases of the first and second internal clock signal pairs CLKI, CLKIB, CLKQ, and CLKQB based on the clock shift signal CLKSFT. A shift operation of the global deskew logic circuit 215 may be similar to the local deskew logic circuit 310 described above with reference to FIG. 3. Each of the selectors 216 may provide clock signal pairs selected according to the selection signal SEL among the shifted first and second internal clock signal pairs and the first and second internal clock signal pairs CLKI, CLKIB, CLKQ, and CLKQB to the plurality of samplers 212_0 to 212_*n*−1.

In an embodiment, the samplers 212_0 to 212_*n*−2 may receive the clock shift signals CLKSFT0 to CLKSFTn−2. The clock shift signals CLKSFT0 to CLKSFTn−2 may include shift magnitudes according to internal temperatures of the samplers 212_0 to 212_*n*−2 for each location. The sampler 212_*n*−1 may receive the clock shift signal CLKSFT. According to an embodiment, because the first and second internal clock signal pairs CLKI, CLKIB, CLKQ, and CLKQB are shifted, the sampler 212_*n*−1 may sample the track signal TS in response to rising edges of the shifted first and second internal clock signal pairs CLKI, CLKIB, CLKQ, and CLKQB.

In an embodiment, because the first and second internal clock signal pairs CLKI, CLKIB, CLKQ, and CLKQB are shifted, the clock shift signals CLKSFT0 to CLKSFTn−2 and CLKSFT provided to the plurality of samplers 212_0 to 212_*n*−1 may be omitted.

Figure 29:
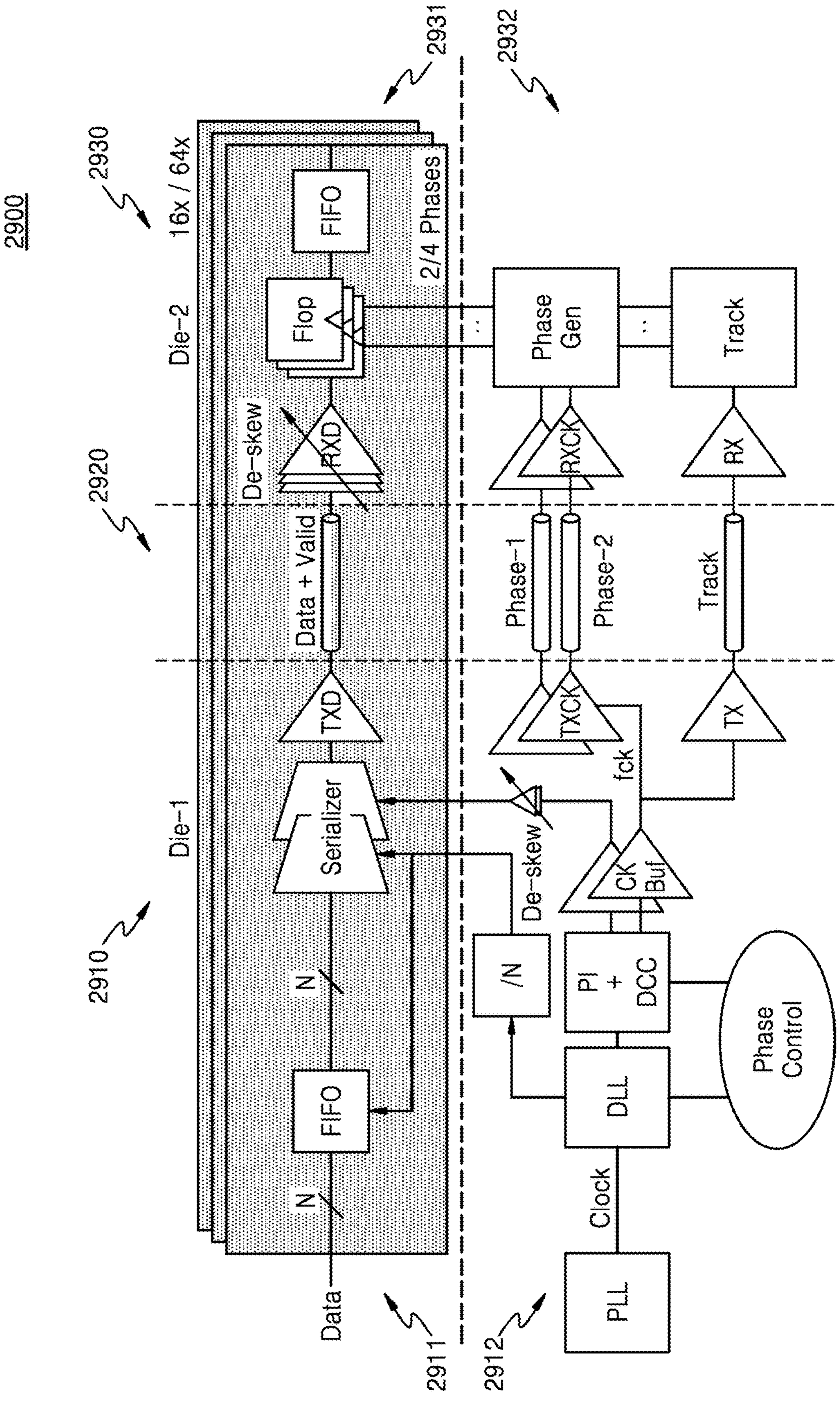
FIG. 29 is a diagram illustrating clock architectures and data architectures in a die-to-die (D2D) interface, according to an embodiment.

FIG. 29 is a diagram illustrating data architectures 2911 and 2931 and clock architectures 2912 and 2932 in a D2D interface according to an embodiment.

Referring to FIG. 29, a semiconductor package 2900 of FIG. 29 may follow an architecture defined in the UCIe standard. The semiconductor package 2900 may include a first die 2910, a D2D interface 2920 (or a D2D interconnect link), and a second die 2930. The first and second dies 2910 and 2930 may be dies of a processor, a multi-core processor, or a memory. In some embodiments, the first and second dies 2910 and 2930 may be of the same type (e.g., both processors), while in other embodiments, the first and second dies 2910 and 2930 may be of different types.

The first die 2910 may be a transmitter die that transmits data, a track signal, and a forward clock signal. The first die 2910 may include the data architecture 2911 and the clock architecture 2912. The data architecture 2911 may include a first-in-first-out (FIFO), a serializer, and a data transmitter. The clock architecture 2912 may include a phase lock loop (PLL) circuit, a delay lock loop (DLL) circuit, a phase interpolator (PI)/duty cycle corrector (DCC) circuit, a divider (see "/N"), a phase controller, a disk circuit, a clock buffer, a clock transmitter, a track transmitter, etc.

In an embodiment, the first die 2910 may generate the data signal DQ, the track signal TS, and the clock signal pair CLKP and CLKN. The first die 2910 may correspond to the first semiconductor device 110 of FIG. 1.

The D2D interface 2920 may include a plurality of data lanes, clock lanes, and track lanes. In some embodiments, the track lane may be implemented by using one of the plurality of data lanes.

The second die 2930 may be a receiver die that receives data, a track signal, and a forward clock signal. The second die 2930 may include the data architecture 2931 and the clock architecture 2932. The data architecture 2931 may include a data receiver, flip-flops, and a FIFO. The flip-flops of the data architecture 2931 may correspond to the latches (e.g., 320) described above. Deskewed clock signals (e.g., the shifted clock signal pairs CLKI, CLKIB, CLKQ, CLKQB, LTCLKI, LTCLKIB, LTCLKQ, LTCLKQB, LDCLKI, LDCLKIB, LDCLKQ, and LDCLKQB) may be provided to the data receiver of the data architecture 2931. The clock architecture 2932 may include a phase generator and a track signal provider.

In an embodiment, the second die 2930 may generate the first and second internal clock signal pairs CLKI, CLKIB, CLKQ, and CLKQB of different phases based on the clock signal pair, sample the data signal DQ and the track signal TS based on the first and second internal clock signal pairs CLKI, CLKIB, CLKQ, and CLKQB, detect a skew status based on the number of times a specific logic level (e.g., a logic high level) of the track signal TS is sampled by each of the first and second internal clock signal pairs CLKI, CLKIB, CLKQ, and CLKQB, and adjust the phases of the first and second internal clock signal pairs CLKI, CLKIB, CLKQ, and CLKQB based on the skew status. The second die 2930 may correspond to the second semiconductor device 120 of FIG. 1.

In an embodiment, the second die 2930 may include the above-described receiver and controller. The receiver may include the data architecture 2931 and the clock architecture 2932. The controller may be connected to the FIFO of the data architecture 2931. The above-described embodiments may be applied to the receiver and the controller included in the second die 2930.

Figure 30:
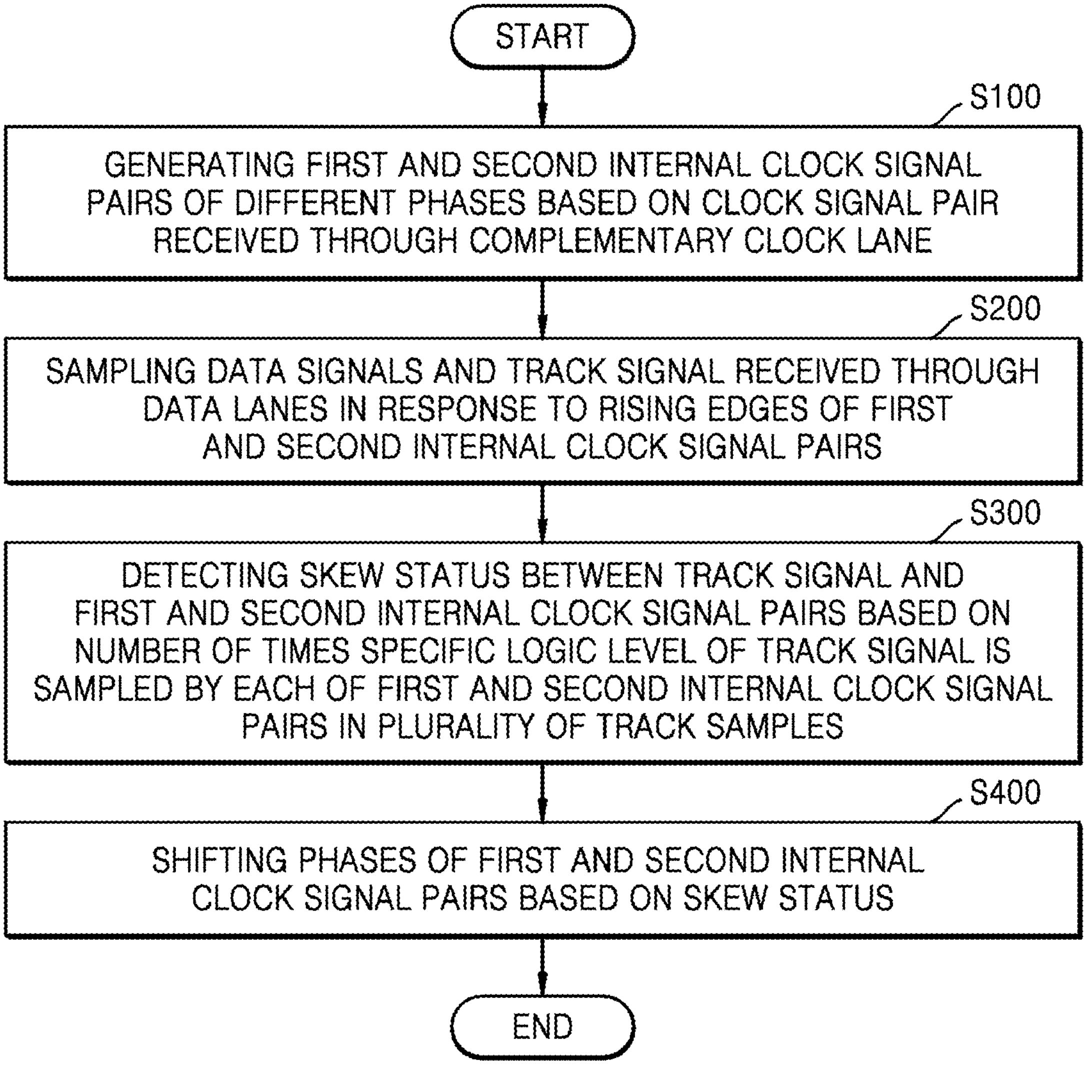
FIG. 30 is a flowchart illustrating an operating method of a semiconductor device, according to an embodiment.

FIG. 30 is a flowchart illustrating an operating method of a semiconductor device according to an embodiment.

Referring to FIG. 30, the operating method may include performing (e.g., by a receiver) an operation S100 that includes generating first and second internal clock signal pairs of different phases based on a clock signal pair received through a complementary clock lane.

The operating method may further include performing an operation S200 that includes sampling (e.g., by the receiver) data signals and a track signal received through data lanes in response to rising edges of the first and second internal clock signal pairs.

In an embodiment, operation S200 further includes generating first and second track clock signal pairs based on the first and second internal clock signal pairs; sampling the track signal in response to rising edges of the first and second track clock signal pairs; generating first and second data clock signal pairs based on the first and second internal clock signal pairs; and sampling each of the data signals in response to rising edges of the first and second data clock signal pairs.

The operating method may further include performing an operation S300 that includes detecting (e.g., by a controller) a skew status between the track signal and the first and second internal clock signal pairs based on the number of times a specific logic level of the track signal is sampled by each of the first and second internal clock signal pairs across a plurality of track samples.

In an embodiment, operation S300 further includes performing a first count operation of counting a first number of times the specific logic level of the track signal is sampled by the first internal clock signal pair; performing a second count operation of counting a second number of times the specific logic level of the track signal is sampled by the second internal clock signal pair; performing a first comparison operation of comparing the first number of times with a first reference number of times to generate a first comparison result; performing a second comparison operation of comparing the second number of times with a second reference number of times to generate a second comparison result; and performing a detection operation of detecting a skew direction of the skew status based on the first comparison result and the second comparison result. For each sampling phase, a repetition operation of repeating the first count operation, the second count operation, the first comparison operation, the second comparison operation, and the detection operation may be performed.

The operating method may further include performing an operation S400 including shifting (e.g., by the controller) the phases of the first and second internal clock signal pairs based on the skew status.

In an embodiment, operation S400 further includes: determining a first shift direction opposite to a first skew direction in response to the first skew direction in a first sampling phase and the first skew direction in a second sampling phase; determining the first shift direction and storing a first boundary in response to the first skew direction in the second sampling phase and an APS in a third sampling phase; determining the first shift direction in response to the APS in each of the third sampling phase and a fourth sampling phase; determining a second shift direction opposite to a second skew direction and storing a second boundary in response to the APS in the fourth sampling phase and the second skew direction in a fifth sampling phase; and shifting the phases of the first and second internal clock signal pairs by using a shift magnitude and a shift direction satisfying a shift range between the first boundary and the second boundary.

In some embodiments, the operating method of the semiconductor device may further include an operation in which a temperature sensor senses an internal temperature of the semiconductor device, an operation in which the controller determines whether the internal temperature is greater than or equal to a reference temperature, and an operation in which the controller initiates an operation of detecting the skew status in response to sensing the internal temperature greater than or equal to the reference temperature.

While the inventive concept has been particularly shown and described with reference to embodiments thereof, it will be understood that various changes in form and details may be made therein without departing from the spirit and scope of the following claims.

What is claimed is:

1. A semiconductor device comprising:
a receiver configured to:
receive a data signal through a first data lane,
receive a track signal through a second data lane,
receive an external clock signal pair through a complementary clock lane,
generate first and second internal clock signal pairs of different phases, based on the external clock signal pair, to sample the data signal and the track signal in response to edges of the first and second internal clock signal pairs, and
output digital signals comprising logic levels of the sampled data signal and the sampled track signal; and
a controller configured to:
receive the digital signals,
detect a skew status between the track signal and the first and second internal clock signal pairs, based on a first number of times a specific logic level of the track signal is sampled in synchronization with the first internal clock signal pair and a second number of times the specific logic level of the track signal is sampled in synchronization with the second internal clock signal pair, and
provide a clock shift signal comprising a shift magnitude and a shift direction to shift phases of the first and second internal clock signal pairs, based on the skew status.

2. The semiconductor device of claim 1, wherein the receiver comprises:
an internal clock generator configured to, based on the external clock signal pair, generate a first true signal and a first complement signal of the first internal clock signal pair and a second true signal and a second complement signal of the second internal clock signal pair;
a first sampler configured to generate first and second data clock signal pairs, based on the clock shift signal and the first and second internal clock signal pairs, and to sample the data signal in response to rising edges of the first and second data clock signal pairs;
a second sampler configured to generate first and second track clock signal pairs having a certain phase difference from the first and second data clock signal pairs, based on the clock shift signal and the first and second internal clock signal pairs, and to sample the track signal in response to rising edges of the first and second track clock signal pairs; and
a digital processing circuit configured to output the logic levels of the sampled data signal and the sampled track signal to the controller.

3. The semiconductor device of claim 2, wherein the second sampler comprises:
a local deskew logic circuit configured to shift phases of the first and second internal clock signal pairs, based on the clock shift signal, and to output the first and second track clock signal pairs;
a first latch circuit configured to latch the track signal in response to a rising edge of a true signal of the first track clock signal pair among the first and second track clock signal pairs;
a second latch circuit configured to latch the track signal in response to a rising edge of a true signal of the second track clock signal pair among the first and second track clock signal pairs;
a third latch circuit configured to latch the track signal in response to a rising edge of a complement signal of the first track clock signal pair; and
a fourth latch circuit configured to latch the track signal in response to a rising edge of a complement signal of the second track clock signal pair.

4. The semiconductor device of claim 2, wherein
the first sampler is disposed at a first location in the receiver,
the second sampler is disposed at a second location closer to a center of the receiver than the first location in the receiver, and
the controller is configured to
provide, to the first sampler, a first clock shift signal including the shift direction and a first shift magnitude, and
provide, to the second sampler, a second clock shift signal including the shift direction and a second shift magnitude larger than the first shift magnitude.

5. The semiconductor device of claim 1, wherein the receiver comprises:
an internal clock generator configured to, based on the external clock signal pair, generate the first internal clock signal pair having a phase difference of 180 degrees and the second internal clock signal pair having a phase difference of 180 degrees;
a global deskew logic circuit configured to shift phases of the first and second internal clock signal pairs, based on the clock shift signal;
a selector configured to output selected internal clock signal pairs among the shifted first and second internal clock signal pairs and the first and second internal clock signal pairs;
a first sampler configured to generate first and second data clock signal pairs, based on the selected internal clock signal pairs of the selector, and to sample the data signal in response to rising edges of the first and second data clock signal pairs;
a second sampler configured to generate first and second track clock signal pairs having a certain phase difference from the first and second data clock signal pairs, based on the selected internal clock signal pairs of the selector, and to sample the track signal in response to rising edges of the first and second track clock signal pairs; and
a digital processing circuit configured to output the logic levels of the sampled data signal and the sampled track signal to the controller.

6. The semiconductor device of claim 1, wherein the controller is configured to
count the first number of times and the second number of times, based on track samples of the track signal for each sampling phase in which one sampling cycle including one period of each of the first and second internal clock signal pairs is repeated m times, where m is a natural number,
compare the first number of times with a first reference number of times to generate a first comparison result and compare the second number of times with a second reference number of times to generate a second comparison result, for each sampling phase, detect a skew direction of the skew status, based on the first comparison result and the second comparison result, and determine boundaries of a shift range that creates an alignment possible status (APS) between the track signal and the first and second internal clock signal pairs, based on a previous skew direction at a previous sampling phase and a current skew direction at a current sampling phase.

7. The semiconductor device of claim 6, wherein the controller is configured to detect a first skew direction when the first comparison result indicates that the first number of times is greater than the first reference number of times, detect a second skew direction opposite to the first skew direction when the second comparison result indicates that the second number of times is greater than the second reference number of times, and detect that the track signal and the first and second internal clock signal pairs are in the APS when the first comparison result indicates that the first number of times is less than or equal to the first reference number of times, and the second comparison result indicates that the second number of times is less than or equal to the second reference number of times.

8. The semiconductor device of claim 7, wherein the controller is configured to determine a first shift direction opposite to the first skew direction, and determine a second shift direction opposite to the second skew direction.

9. The semiconductor device of claim 7, wherein the controller is configured to determine a first boundary when the first skew direction is detected in the previous sampling phase and the APS is detected in the current sampling phase, determine a second boundary when the second skew direction is detected in the previous sampling phase and the APS is detected in the current sampling phase, and determine a shift magnitude and a shift direction, satisfying a shift range between the first boundary and the second boundary.

10. The semiconductor device of claim 1, further comprising a temperature sensor configured to sense an internal temperature of the semiconductor device and to provide a sensing signal including a sensing value of the internal temperature to the controller, wherein the controller is further configured to determine whether the internal temperature is greater than or equal to a reference temperature, and initiate an operation of detecting the skew status when the internal temperature is greater than or equal to the reference temperature.

11. An operating method of a semiconductor device, the operating method comprising:

generating first and second internal clock signal pairs of different phases, based on a clock signal pair received through a complementary clock lane;

sampling data signals and a track signal received through data lanes in response to rising edges of the first and second internal clock signal pairs;

detecting a skew status between the track signal and the first and second internal clock signal pairs, based on a number of times a specific logic level of the track signal is sampled in synchronization with each of the first and second internal clock signal pairs; and shifting phases of the first and second internal clock signal pairs, based on the skew status.

12. The operating method of claim 11, wherein the detecting of the skew status comprises:

performing a first count operation of counting a first number of times the specific logic level of the track signal is sampled in synchronization with the first internal clock signal pair;

performing a second count operation of counting a second number of times the specific logic level of the track signal is sampled in synchronization with the second internal clock signal pair;

performing a first comparison operation of comparing the first number of times with a first reference number of times to generate a first comparison result;

performing a second comparison operation of comparing the second number of times with a second reference number of times to generate a second comparison result;

performing a detection operation of detecting a skew direction of the skew status, based on the first comparison result and the second comparison result; and performing a repetition operation of repeating the first count operation, the second count operation, the first comparison operation, the second comparison operation and the detection operation, for each sampling phase in which one sampling cycle including one period of each of the first and second internal clock signal pairs is repeated m times, where m is a natural number.

13. The operating method of claim 12, wherein the shifting of the phases of the first and second internal clock signal pairs comprises:

determining a first shift direction opposite to a first skew direction in response to the first skew direction in a first sampling phase and the first skew direction in a second sampling phase;

determining the first shift direction and storing a first boundary in response to the first skew direction in the second sampling phase and an alignment possible status (APS) in a third sampling phase;

determining the first shift direction in response to the APS in each of the third sampling phase and a fourth sampling phase;

determining a second shift direction opposite to a second skew direction and storing a second boundary in response to the APS in the fourth sampling phase and the second skew direction in a fifth sampling phase; and shifting the phases of the first and second internal clock signal pairs by using a shift magnitude and a shift direction, which satisfy a shift range between the first boundary and the second boundary.

14. The operating method of claim 11, wherein the sampling of the data signals and the track signals comprises:

generating first and second track clock signal pairs, based on the first and second internal clock signal pairs;

sampling the track signal in response to rising edges of the first and second track clock signal pairs;

generating first and second data clock signal pairs, based on the first and second internal clock signal pairs; and sampling each of the data signals in response to rising edges of the first and second data clock signal pairs.

15. The operating method of claim 11, further comprising:

sensing an internal temperature of the semiconductor device; and determining whether the internal temperature is greater than or equal to a reference temperature; and initiating an operation of detecting the skew status in response to sensing the internal temperature greater than or equal to the reference temperature.

16. A semiconductor package comprising:

a first die configured to generate a data signal, to generate a track signal, and to generate a clock signal pair;

a die-to-die (D2D) interface comprising a first data lane transmitting the data signal, a second data lane transmitting the track signal, and a complementary clock lane transmitting the clock signal pair; and a second die configured to:

generate first and second internal clock signal pairs of different phases, based on the clock signal pair, sample the data signal and the track signal, based on the first and second internal clock signal pairs, detect a skew status between the track signal and the first and second internal clock signal pairs, based on a number of times a specific logic level of the track signal is sampled in synchronization with each of the first and second internal clock signal pairs, and adjust phases of the first and second internal clock signal pairs, based on the skew status.

17. The semiconductor package of claim 16, wherein the second die comprises:

a receiver configured to generate the first and second internal clock signal pairs, to sample the data signal and the track signal in response to rising edges of the first and second internal clock signal pairs, and to output logic levels of the sampled data signal and the sampled track signal; and a controller configured to receive logic levels of the sampled data signal and the sampled track signal, to detect the skew status, based on a first number of times a specific logic level of the track signal is sampled in synchronization with the first internal clock signal pair and a second number of times the specific logic level of the track signal is sampled in synchronization with the second internal clock signal pair, and to, based on the skew status, provide a clock shift signal comprising a shift magnitude and a shift direction to shift phases of the first and second internal clock signal pairs.

18. The semiconductor package of claim 17, wherein the controller is further configured to count the first number of times and the second number of times, based on track samples of the track signal, for each sampling phase in which one sampling cycle including one period of each of the first and second internal clock signal pairs is repeated m times, where m is a natural number;

compare the first number of times with a first reference number of times to generate a first comparison result, and compare the second number of times with a second reference number of times to generate a second comparison result, for each sampling phase;

detect a skew direction of the skew status, based on the first comparison result and the second comparison result; and determine boundaries of a shift range that creates an alignment possible status (APS) between the track signal and the first and second internal clock signal pairs, based on a previous skew direction at a previous sampling phase and a current skew direction at a current sampling phase.

19. The semiconductor package of claim 18, wherein the controller is further configured to detect a first skew direction when the first comparison result indicates that the first number of times is greater than the first reference number of times;

detect a second skew direction opposite to the first skew direction when the second comparison result indicates that the second number of times is greater than the second reference number of times; and detect that the track signal and the first and second internal clock signal pairs are in the APS when the first comparison result indicates that the first number of times is less than or equal to the first reference number of times, and the second comparison result indicates that the second number of times is less than or equal to the second reference number of times.

20. The semiconductor package of claim 18, wherein the receiver comprises:

a first sampler configured to generate first and second data clock signal pairs, based on the clock shift signal and the first and second internal clock signal pairs, and to sample the data signal in response to rising edges of the first and second data clock signal pairs; and a second sampler configured to generate first and second track clock signal pairs having a certain phase difference from the first and second data clock signal pairs, based on the clock shift signal and the first and second internal clock signal pairs, and to sample the track signal in response to rising edges of the first and second track clock signal pairs.

* * * * *